(12) United States Patent
Han et al.

(10) Patent No.: US 12,215,023 B2
(45) Date of Patent: Feb. 4, 2025

(54) MICROFLUIDIC DEVICES AND ASSOCIATED METHODS

(71) Applicant: The Texas A&M University System, College Station, TX (US)

(72) Inventors: Arum Han, College Station, TX (US); Jose A. Wippold, Bryan, TX (US); Adrian R. Guzman, Houston, TX (US); Can Huang, Houston, TX (US); Dimitra Stratis-Cullum, Laurel, MD (US)

(73) Assignee: THE TEXAS A&M UNIVERSITY SYSTEM, College Station, TX (US)

( * ) Notice: Subject to any disclaimer, the term of this patent is extended or adjusted under 35 U.S.C. 154(b) by 1088 days.

(21) Appl. No.: 17/065,471

(22) Filed: Oct. 7, 2020

(65) Prior Publication Data

US 2021/0221676 A1 Jul. 22, 2021

Related U.S. Application Data

(60) Provisional application No. 62/916,726, filed on Oct. 17, 2019, provisional application No. 62/911,924, filed on Oct. 7, 2019.

(51) Int. Cl.
*B81C 1/00* (2006.01)
*C08F 2/48* (2006.01)
*G03F 7/00* (2006.01)

(52) U.S. Cl.
CPC ............ *B81C 1/00031* (2013.01); *C08F 2/48* (2013.01); *G03F 7/0037* (2013.01); *B81C 2201/034* (2013.01)

(58) Field of Classification Search
CPC ............... B01L 3/5027; B01L 2300/08; B01L 2300/0816; B01L 2300/0848; B01L 2300/0877; B81B 2303/0384; B81B 2201/05; B81C 1/00031; B81C 2201/034; C08F 2/48; G03F 7/0037
See application file for complete search history.

(56) References Cited

U.S. PATENT DOCUMENTS

| | | | |
|---|---|---|---|
| 2011/0271746 A1* | 11/2011 | Shinoda ................ | B01L 3/0268 73/61.71 |
| 2013/0130262 A1* | 5/2013 | Battrell ............... | B01L 3/50273 435/6.12 |
| 2015/0352547 A1* | 12/2015 | Breinlinger ............ | C12M 23/16 435/395 |
| 2017/0157606 A1* | 6/2017 | Kim ......................... | B81B 7/00 |
| 2018/0088025 A1* | 3/2018 | Haghgooie ............ | G01N 21/03 |

* cited by examiner

*Primary Examiner* — Jill A Warden
*Assistant Examiner* — Michael Stanley Gzybowski
(74) *Attorney, Agent, or Firm* — CONLEY ROSE, P.C.

(57) ABSTRACT

A microfluidic device includes a microfluidic channel formed in the microfluidic device and defined by a floor and a ceiling positioned vertically above the floor, wherein the microfluidic channel includes at least one fluid inlet configured to receive a fluid flow and at least one fluid outlet, and wherein at least one of the ceiling and the floor of the microfluidic channel is sloped relative to a horizontal plane.

19 Claims, 13 Drawing Sheets

MICROFLUIDIC DEVICES AND ASSOCIATED METHODS

CROSS-REFERENCE TO RELATED APPLICATIONS

This application claims benefit of U.S. provisional patent application Ser. No. 62/911,924 filed Oct. 7, 2019, and entitled "Bubble Transition Using Sloped Devices in Microfluidic Systems," and U.S. provisional patent application Ser. No. 62/916,726 filed Oct. 17, 2019, and entitled "Bubble Transition Using Sloped Devices in Microfluidic Systems," each of which are hereby incorporated herein by reference in its entirety.

STATEMENT REGARDING FEDERALLY SPONSORED RESEARCH OR DEVELOPMENT

This invention was made with government support under W911NF-17-2-0144 cooperative agreement between Texas A&M Engineering Experiment Station and the Army Research Laboratory. The government has certain rights in the invention.

BACKGROUND

Microfluidic systems may be used to manipulate fluids at sub-millimeter scales for a variety of purposes. For example, microfluidic systems may be utilized to manipulate droplets in the execution of bioassays. Particularly, in droplet microfluidics, pico- to nano-liter volume two-phase emulsion droplets may function as independent and parallel chemical or bio reactors, where such droplets may be generated and manipulated at a relatively high throughput. Due to the relatively high throughput made possible in droplet microfluidics, droplet microfluidic technology may potentially reduce the sample/reagent volume typically required by laboratory operations and may also reduce the time required to perform such operations. As a result of the many advantages, such as high-throughput experimentation, automation, and single-cell resolution, to name a few, droplet microfluidics have been utilized in wide varieties of applications.

Microfluidic systems may comprise one or more microfluidic structures or devices fluidically coupled together by one or more fluid conduits (e.g., flexible tubing, etc.). Microfluidic devices may generally include a body or chip in which one or more microfluidic channels are formed. The microfluidic channel may have a floor, a ceiling opposite the floor, and a pair of sidewalls extending vertically between the ceiling and floor of the microfluidic channel. The spacing between the pair of sidewalls may define a lateral width of the channel while a spacing between the ceiling and floor may define a vertical height of the channel, where the width and height of the microfluidic channel are each on a sub-millimeter scale. Master molds from which microfluidic devices having one or more microfluidic channels may be produced through a photolithography-based fabrication process.

BRIEF SUMMARY OF THE DISCLOSURE

An embodiment of a microfluidic device comprises a microfluidic channel formed in the microfluidic device and defined by a floor and a ceiling positioned vertically above the floor; wherein the microfluidic channel comprises at least one fluid inlet configured to receive a fluid flow and at least one fluid outlet; and wherein at least one of the ceiling and the floor of the microfluidic channel is sloped relative to a horizontal plane. In some embodiments, at least one of the ceiling or the floor is curved. In some embodiments, the microfluidic device comprises an air bubble trap and the microfluidic channel comprises a sloped chamber, wherein the ceiling of the sloped chamber is sloped relative to the horizontal plane. In certain embodiments, the microfluidic device comprises a vacuum chamber defined by a gas permeable membrane, wherein the vacuum chamber is positioned vertically above the sloped chamber; and a vacuum pump configured to apply a negative pressure to the vacuum chamber whereby one or more air bubbles accumulated in the sloped chamber are transported through the ceiling of the sloped chamber and into the vacuum chamber. In certain embodiments, the microfluidic channel comprises a pair of collection channels extending from the sloped chamber; and a pair of collection chambers extending from the pair of collection channels and configured to collect air bubbles therein; wherein the sloped chamber comprises an array of micropillars extending downwards from the ceiling of the sloped chamber and wherein the array of micropillars are configured to prevent air bubbles from travelling between an inlet and an outlet of the sloped chamber. In some embodiments, the microfluidic channel comprises array of the first sloped chambers; an array of second sloped chambers positioned in series with the array of first sloped chambers; an array of third sloped chambers positioned in series with both the array of first sloped chambers and the array of second sloped chambers; and wherein a maximum height of each of the array of first sloped chambers is greater than a maximum height of each of the array of second sloped chambers, and the maximum height of each of the array of second sloped chambers is greater than a maximum height of each of the array of third sloped chambers. In some embodiments, the microfluidic channel comprises a droplet merging chamber, and wherein the ceiling of the microfluidic channel associated with the droplet merging chamber has a convex curvature. In certain embodiments, the fluid inlet of the microfluidic channel is positioned at an external surface of the microfluidic device; the microfluidic channel comprises a sloped chamber extending from the fluid inlet, the sloped chamber comprising a ninety-degree bend and wherein the floor associated with the sloped chamber is sloped relative to the horizontal plane. In certain embodiments, the microfluidic channel comprises a droplet compression chamber and wherein the ceiling associated with the droplet compression chamber slopes relative to the horizontal plane from a first height at an inlet of the droplet compression chamber to a minimum height of the droplet compression chamber.

An embodiment of a method for operating a microfluidic device comprises (a) providing a fluid inlet of a microfluidic channel formed in the microfluidic device with a fluid flow, wherein the microfluidic channel is defined by a floor and a ceiling positioned vertically above the floor; (b) flowing the fluid flow through a sloped chamber of the microfluidic channel, wherein at least one of the ceiling and the floor of the microfluidic channel is sloped relative to a horizontal plane; and (c) transporting the fluid flow through a fluid outlet of the microfluidic channel whereby the fluid flow exits the microfluidic device. In some embodiments, the method further comprises (d) applying a negative pressure to a vacuum chamber positioned above and in fluid communication with the sloped chamber; and (e) transporting an air bubble trapped in the vacuum chamber through a gas permeable membrane defining the vacuum chamber. In some embodiments, the method further comprises (d) obstructing the passage of a bubble suspended in the fluid flow from reaching an outlet of the sloped chamber by an array of micropillars extending from the ceiling of the sloped chamber. In certain embodiments, the method further comprises (d) compressing a droplet suspended in the fluid flow in the sloped chamber, wherein the ceiling of the sloped chamber slopes relative to the horizontal plane from a first height at an inlet of the sloped chamber to a minimum height of the sloped chamber. In certain embodiments, the method further comprises (d) transporting the fluid flow through a junction formed between a tubing coupled to the microfluidic device and the fluid inlet, or a second microfluidic device coupled to the first microfluidic device and the fluid inlet, wherein the fluid inlet is positioned on an external surface of the microfluidic device and wherein the sloped chamber extends from the fluid inlet along a ninety degree bend.

An embodiment of a method for fabricating a microfluidic device comprising a sloped microfluidic channel comprises (a) fabricating a first layer from a master mold defining a first portion of the microfluidic channel by a laser fabrication process; and (b) producing the microfluidic device from the master mold comprising the first layer. In some embodiments, the laser fabrication process comprises a two-photon polymerization fabrication process. In some embodiments, the method further comprises (c) fabricating a second layer of the master mold defining a second portion of the microfluidic channel by a photolithographic fabrication process; wherein the microfluidic device comprises the first layer and the second layer. In certain embodiments, the first portion of the microfluidic channel comprises a sloped chamber comprising at least one of a floor and a ceiling located vertically above the floor is sloped relative to a horizontal plane. In certain embodiments, the microfluidic device comprises an air bubble trap and wherein the first layer of the microfluidic channel comprises an accumulation chamber comprising a ceiling that is sloped relative to a horizontal plane. In some embodiments, the first layer of the microfluidic channel comprises a droplet merging chamber comprising a floor and a ceiling positioned vertically above the floor that are both sloped relative to a horizontal plane.

BRIEF DESCRIPTION OF THE DRAWINGS

For a detailed description of exemplary embodiments of the disclosure, reference will now be made to the accompanying drawings in which.

DETAILED DESCRIPTION OF THE DISCLOSED EMBODIMENTS

Figure 1:
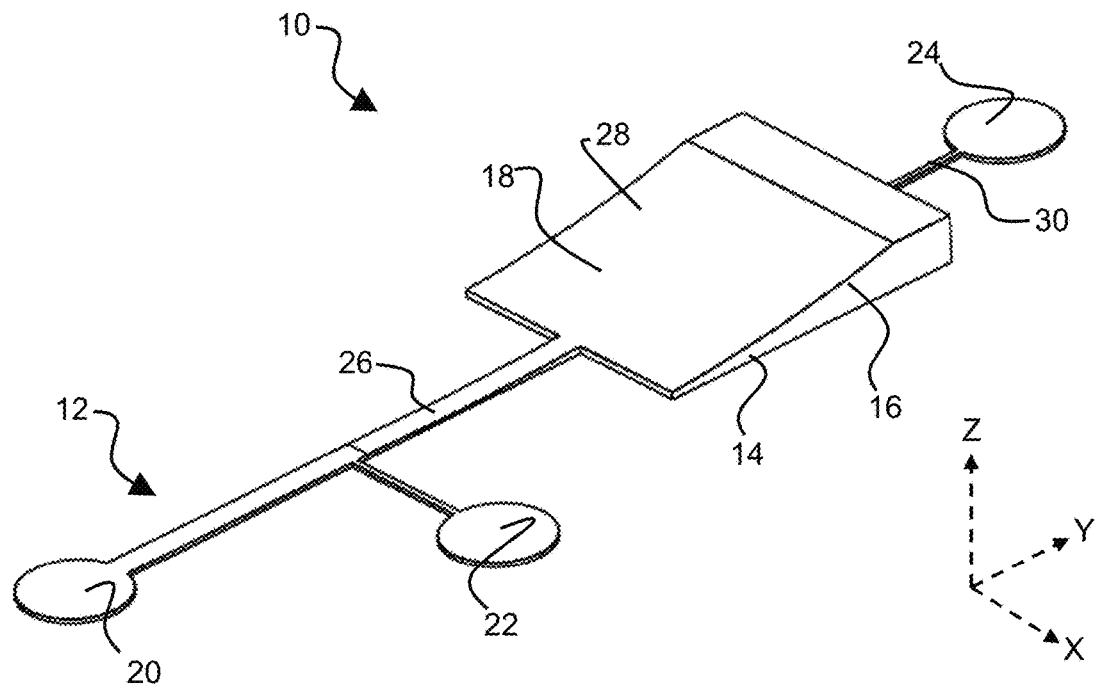
FIG. 1 is a perspective view of a microfluidic device according to some embodiments.

The following discussion is directed to various exemplary embodiments. However, one skilled in the art will understand that the examples disclosed herein have broad application, and that the discussion of any embodiment is meant only to be exemplary of that embodiment, and not intended to suggest that the scope of the disclosure, including the claims, is limited to that embodiment.

Certain terms are used throughout the following description and claims to refer to particular features or components. As one skilled in the art will appreciate, different persons may refer to the same feature or component by different names. This document does not intend to distinguish between components or features that differ in name but not function. The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection, or through an indirect connection via other devices, components, and connections. In addition, as used herein, the terms "axial" and "axially" generally mean along or parallel to a central axis (e.g., central axis of a body or a port), while the terms "radial" and "radially" generally mean perpendicular to the central axis. For instance, an axial distance refers to a distance measured along or parallel to the central axis, and a radial distance means a distance measured perpendicular to the central axis.

As described above, microfluidic devices comprise devices including one or more microfluidic channels formed therein. As used herein, the term "microfluidic channel" is defined herein as channels having a maximum width and a maximum height of 2,000 micron (µm) or less. Additionally, microfluidic devices may be produced through a photolithography production process. Particularly a master mold from which polymer-based microfluidic devices may be replica-molded may be produced through photolithography where a pattern is created with a fixed vertical height within the substrate of the master mold. The fixed height may be determined by a thickness of a spin-coated photoresist formed on the substrate. Thus, a microfluidic channel formed within the substrate of the master mold may only have a fixed vertical height. For this reason, conventional photolithography may be referred to as a 2.5-dimensional microfabrication technique given that photolithography may lack the spatial vertical or Z-direction shape patterning capability that true 3-dimensional fabrication methods (e.g., 3D printing, etc.) may produce.

In certain applications it may be desirable to vary the height of a microfluidic channel along its lengths. As one example, it may be desirable to reduce the height of the microfluidic channel at a predetermined location along the channel in order to squeeze a droplet flowing through the channel whereby the squeezed droplet may be examined by a sensor or other instrument to achieve higher signal-to-noise ratio. However, photolithography based production techniques may only construct variable-height microfluidic channels by overlaying a plurality of separate patterned layers. For instance, a first photoresist layer may be patterned to produce a first patterned layer. Subsequently, a second photoresist layer may be spin-coated onto the first patterned photoresist layer. The second photoresist layer may then be patterned to produce a second patterned layer placed directly on top of the first patterned layer. This process is very time consuming and labor intensive and thus only abrupt, stairstep changes in height of the microfluidic channel may be produced through photolithography fabrication processes. However, in droplet microfluidics abrupt transitions in height of the microfluidic channel may result in dead volume, as well as large shearing forces being applied to droplets flowing through the abrupt transition, causing breaking of the droplets to be observed.

Air bubbles in aqueous flow comprise another form of "droplet" in microfluidics. Particularly, air bubbles that form in microfluidic channels may disrupt the operation of a microfluidic system comprising said microfluidic channels by interfering with the manipulation of the fluid flowing through the microfluidic channels. Some microfluidic systems may include macroscale air bubble traps configured to trap and/or remove air bubbles from the microfluidic system. However, conventional macroscale air bubble traps are typically positioned along fluid conduits interconnecting a plurality of microfluidic devices, and are not incorporated directly into the microfluidic device itself. Thus, conventional air bubble traps may not have the capability to capture air bubbles which form or are otherwise located in the microfluidic channels of a microfluidic device. Additionally, macroscale air bubble traps may require the integration of additional channel-to-tubing interfaces prone to the formation of air bubbles within the fluid stream flowing through the channel-to-tubing interface.

Accordingly, embodiments disclosed herein include microfluidic devices which include air bubble traps incorporated therein configured to trap and/or remove air bubbles located in one or more microfluidic channels of the microfluidic device. Particularly, microfluidic devices disclosed herein may include a variable height microfluidic channel having a ceiling which is sloped relative to a horizontally or laterally extending plane. The term "sloped" is defined herein as comprising both linear (e.g., planar) surfaces that are inclined or sloped relative to a horizontal plane as well as curved surfaces Additionally, microfluidic devices disclosed herein may include a microfluidic channel having a ceiling which is curved. The sloped ceiling of the microfluidic channel may allow the relatively buoyant air bubbles to travel vertically upwards along the sloped ceiling whereby the air bubbles may accumulate be trapped and potentially removed from the microfluidic channel. The trapping and removal of the air bubbles allows an aqueous solution flowing through the microfluidic channel to flow unimpeded by the now trapped and/or removed air bubbles. In this manner, air bubbles may be removed directly from the microfluidic device via the air bubble trap incorporated into the device.

The variable height, sloped microchannels disclosed herein may be employed in microfluidic devices other than air bubble traps. For example, embodiments disclosed herein include microfluidic devices comprising one or more microfluidic channels having gradual changes in vertical height (via, e.g., a sloped ceiling and/or floor) configured to manipulate droplets without breaking and/or merging the droplets together during said manipulation. For example, sloped microfluidic channels may be employed to gradually vertically transition droplets between two or more layers of the microfluidic channel, between two or more microfluidic devices, and/or from tubing/reservoirs into microfluidic devices. It may be understood that vertical transition of droplets may be utilized in many microfluidic applications and assays. In this disclosure, the term "droplet" is defined as two phase emulsion droplets including, but not limited to, water-in-oil, oil-in-water, air-in-water, air-in-oil, water-in-air, oil-in-air. Droplets may be referred to interchangeably herein as "bubble", "droplet", or "microdroplet".

Embodiments disclosed herein include microfluidic devices fabricated using a three-dimensional laser fabrication process such as a two-photon polymerization ("2PP") microfabrication process. Unlike the conventional photolithographic fabrication process described above, the 2PP microfabrication process described herein comprises a three-dimensional fabrication technique having vertical patterning capability without the need to overlay multiple patterned layers (as with traditional photolithography) to achieve a variable height microfluidic channel. Using the 2PP microfabrication procedures described herein, microfluidic devices comprising variable height, sloped microfluidic channels may be fabricated in a minimal amount of time and require a minimal amount of labor. Through the creation of microfluidic channels having gradual vertical transitions, the running of complex, multi-step assays in droplet format may be enabled with significantly higher stability. The potential applications of sloped microfluidic channels (created using, for example, a 2PP microfabrication technique) to smoothly transition air bubbles upward may also lead to many other possibilities in removing or preventing air bubbles to cause disruption in microfluidic operations.

Figure 2:
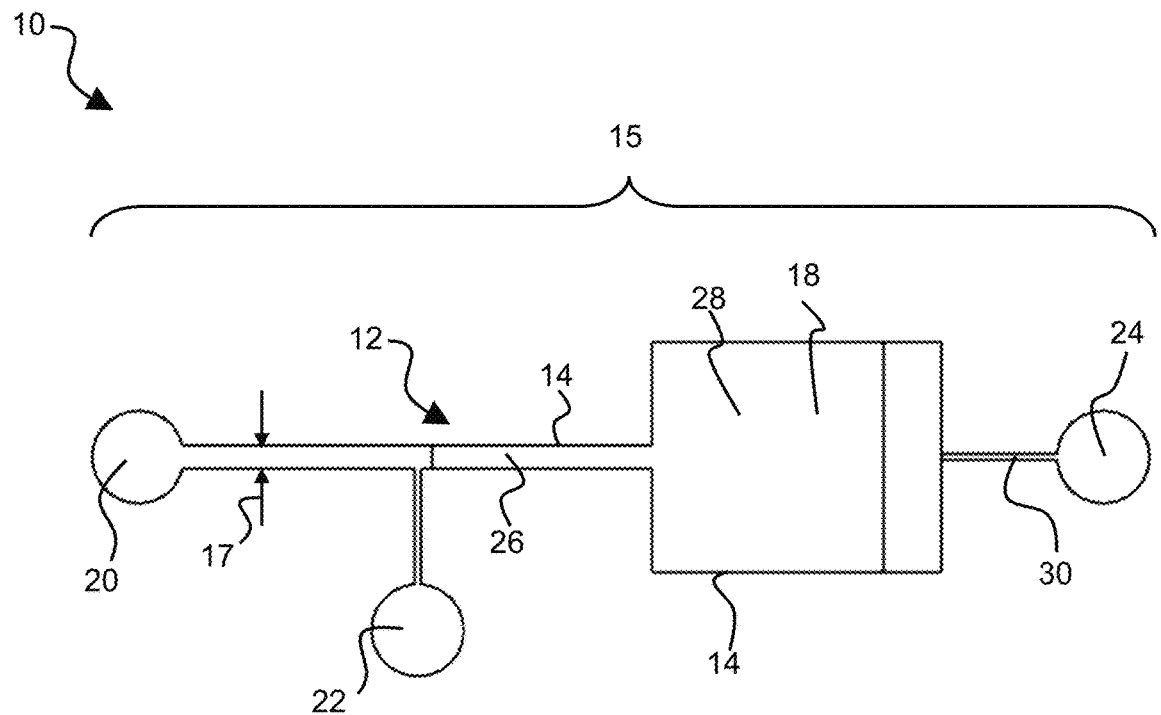
FIG. 2 is a top view of the microfluidic device of FIG. 1.
Figure 3:
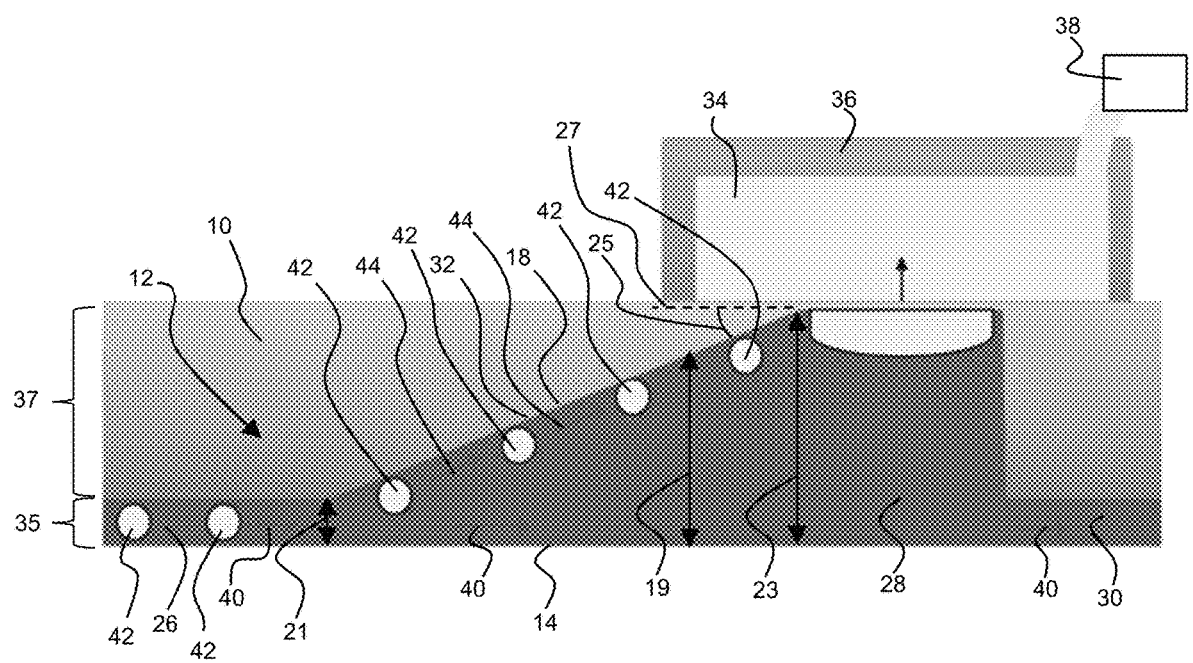
FIG. 3 is a side cross-sectional view of the microfluidic device of FIG. 1.

Referring initially to FIGS. 1-3, a microfluidic structure or device 10 is shown. Microfluidic device 10 may comprise a microfluidic air bubble trap and thus may also be referred to herein as air bubble trap 10. Microfluidic device 10 may generally comprise a microfluidic channel 12 formed therein that is defined by a lower surface or floor 14, a pair of sidewalls 16, and an upper surface or ceiling 18. In an embodiment, the material forming microfluidic device 10 may comprise gas-permeable polydimethyl siloxane (PDMS) membrane; however, in other embodiments, the material comprising microfluidic device 10 may vary. Ceiling 18 may be located vertically above floor 14 and the pair of sidewalls 16 may extend from the floor 14 to the ceiling 18. Additionally, the microfluidic channel 12 may comprise a length 15 (shown in FIG. 2) extending in a first horizontal or "Y" direction (shown in FIG. 1), a width 17 (shown in FIG. 2) extending in a second horizontal or "X" direction (shown in FIG. 1), and a height 19 (shown in FIG. 3) extending in a vertical or "Z" direction (shown in FIG. 1) where the X, Y, and Z directions may each be orthogonal to each other thereby defining a three-dimensional space.

In an embodiment, the microfluidic channel 12 of device 10 may generally include a first fluid inlet 20, a second fluid inlet 22, a fluid outlet 24, an upstream channel 26, a sloped chamber 28, and a downstream channel 30. While only the pair of fluid inlets 20, 22 and a single fluid outlet 24 are shown in FIGS. 1-3, in other embodiments, microfluidic channel 12 may include varying numbers of fluid inlets and fluid outlets. As used herein, the term "chamber" may refer to both a space configured to trap or collect fluid as well as a portion of a channel or other conduit through which fluid is permitted to travel. In some embodiments, microfluidic channel 12 may include components in addition to the components described herein. Each of the fluid inlets 20, 22 of microfluidic device 10 may be coupled to tubing and may be configured to receive a fluid. For example, a first inlet 20 may be configured to receive an aqueous solution or fluorinated oil from a first tubing while the second fluid inlet 22 may be configured to receive a fluid different from that received by first fluid inlet 20. The fluid outlet 24 may be configured to receive a fluid flow that has been transported through the microfluidic channel 12. Upstream channel 26 may extend from the fluid inlets 10, 12 to the sloped chamber 28 while the downstream channel 30 may extend from the sloped chamber 28 to the fluid outlet 24.

The height 19 of microfluidic channel 12 may vary along the length of channel 12. As shown particularly in FIG. 3, the portion of ceiling 18 associated with sloped chamber 28 may comprise a sloped ceiling 32 whereby the height 19 of sloped chamber 28 may vary along the length of chamber 28 between a minimum height 21 located at an inlet of sloped chamber 28 and a maximum height 23 located adjacent an outlet of the sloped chamber 28. In an embodiment, the minimum height 21 may be equal to a height of at least a portion of the upstream channel 26 and/or the downstream channel 30 while the maximum height 23 of sloped chamber 28 may comprise a maximum height of the microfluidic channel 12.

The sloped ceiling 32 may extend or be disposed at a non-zero angle 25 relative to a horizontal plane 27 extending in the X and Y directions. The horizontal plane 27 may extend orthogonally the pair of sidewalls 16 of microfluidic channel 12. In an embodiment, the non-zero angle 25 may range approximately between one degree and 60 degrees; however, in other embodiments, the magnitude of non-zero angle 25 may vary. In some embodiments, sloped ceiling 32 may extend linearly between the minimum height 21 and the maximum height 23. In other embodiments, sloped ceiling 32 may be curved with radius of curvature that is constant or variable along the length of sloped ceiling 32. For example, sloped ceiling 32 may have an arc length between approximately 1 millimeter (mm) and 5 mm; however, in other embodiments, an arc length of sloped ceiling 32 may vary. In an embodiment, the sloped ceiling 32 may have a constantly changing point-by-point curvature until reaching the maximum height 23. Additionally, in an embodiment, the maximum height 23 of sloped chamber 28 (and thus the maximum height of microfluidic channel 12 in some embodiments) may be between approximately 300 µm and 400 µm while a maximum height of the upstream channel and/or the downstream channel may be between approximately 25 µm and 50 µm; however, in other embodiments, the maximum height 23 and the height 19 of the various components of microfluidic channel 12 may vary.

In an embodiment, microfluidic device 10 may additionally include a vacuum chamber 34 positioned vertically above at least a portion of the sloped chamber 28. Particularly, vacuum chamber 34 may be positioned directly above the portion of sloped chamber 28 having the maximum height 23. In an embodiment, vacuum chamber 34 may be sized to collect approximately between 0.5 and 1.5 microliters (µl) of fluid; however, in other embodiments, the configuration of vacuum chamber 34 may vary. Vacuum chamber 34 may be at least partially surrounded or defined by a gas permeable membrane 36 such as, for example, a PDMS membrane. A vacuum pump 38 (or other vacuum inducing mechanism) may be fluidically coupled to the vacuum chamber 34 to apply a vacuum to the vacuum chamber 34. Particularly, the vacuum applied to vacuum chamber 34 may extract gas through the gas-permeable sloped ceiling 32 of sloped chamber 28.

During operation of microfluidic device 10, one or more fluids may enter the microfluidic channel 12 of microfluidic device 10 via tubing (not shown in FIGS. 1-3) attached to the fluid inlets 20, 22 of microfluidic channel 12, forming a fluid flow (indicated by arrows 40 in FIG. 3) within the channel 12. The fluid flow 40 may comprise a liquid flow such as an aqueous solution or fluorinated oil. Air bubbles 42 may enter the fluid flow as the fluid flow transitions from the tubing to the microfluidic channel 12 and thus may be entrained in the fluid flow 40 as the fluid flows through upstream channel 26. As the fluid flow 40 enters sloped chamber 28, air bubbles 42, being buoyant in the fluid flow 40, travel upwards along a bubble flowpath (indicated by arrows 44 in FIG. 3) that extends along sloped ceiling 32 until air bubbles 42 enter vacuum chamber 34.

Negative or vacuum pressure applied to vacuum chamber 34 (via, e.g., vacuum pump 38) may remove the air bubbles collected within vacuum chamber 34 by continuously transporting the captured air bubbles through the gas permeable membraned 36, thereby removing the air bubbles from microfluidic channel 12 and device 10. In an embodiment, the rate at which air bubbles are removed from microfluidic channel 12 via vacuum chamber 34 may be controlled by altering the thickness of the gas permeable membrane 36 and/or by altering the amount of negative pressure applied to vacuum chamber 34. With the buoyant air bubbles being transported vertically upwards along bubble flowpath 44, the relatively denser fluid flow 40 may flow through unimpeded through sloped chamber 28 along the bottom 14. The fluid flow 40 may enter downstream channel 30 from sloped chamber 28 and exit the microfluidic device 10 via tubing fluidically coupled to the fluid outlet 24 of microfluidic channel 12. As will be described further herein, in an embodiment, at least a portion of a master mold used to form the microfluidic device 10 may be fabricated using a laser fabrication process, such as a 2PP microfabrication process.

Figure 4:
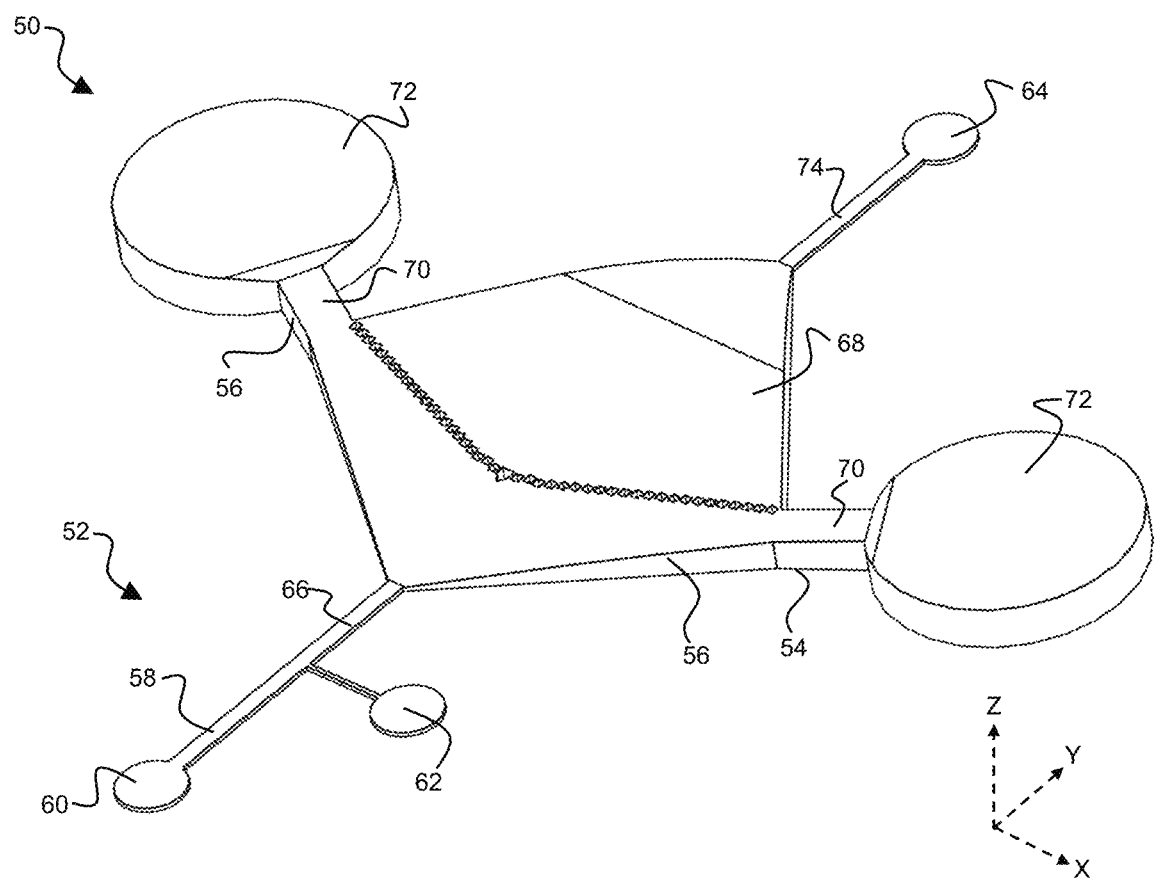
FIG. 4 is a perspective view of another microfluidic device according to some embodiments.
Figure 5:
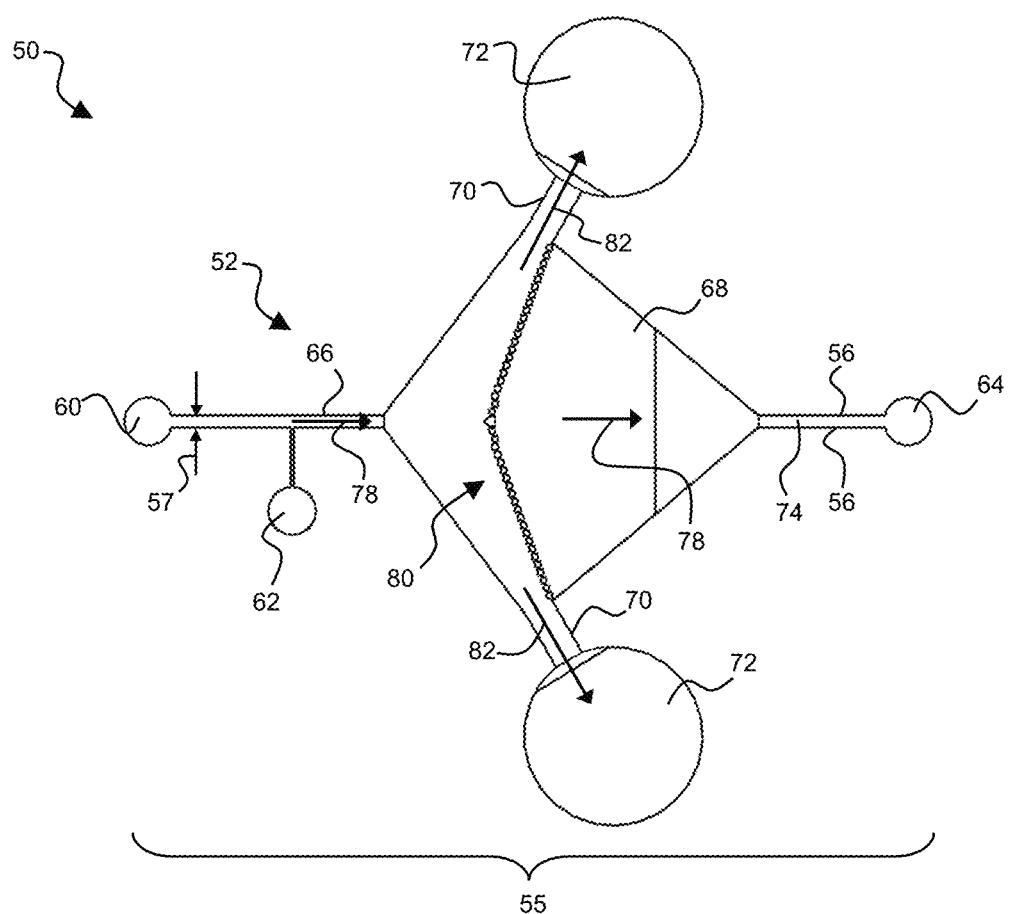
FIG. 5 is a top view of the microfluidic device of FIG. 4.
Figure 6:
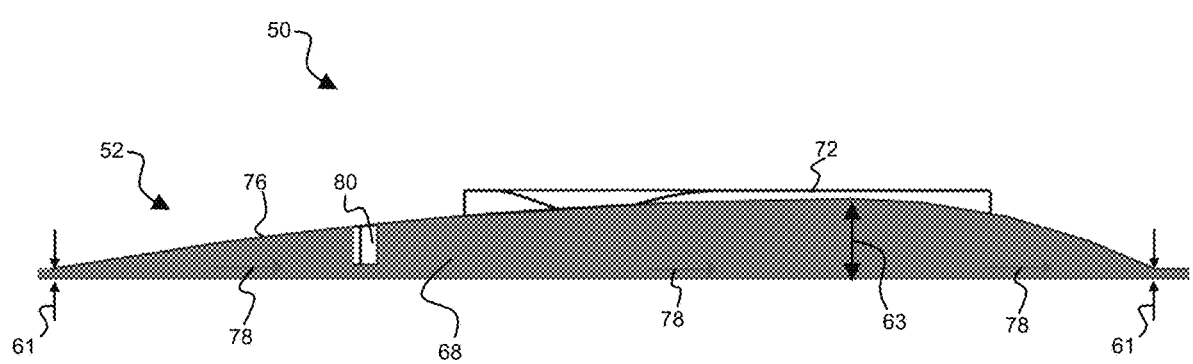
FIG. 6 is a side cross-sectional view of the microfluidic device of FIG. 4.

Referring to FIGS. 4-6, another microfluidic structure or device 50 is shown. Microfluidic device 50 may comprise a microfluidic air bubble trap and thus may also be referred to herein as air bubble trap 50. In an embodiment, the material forming microfluidic device 50 may comprise gas-permeable membrane, such as a PDMS membrane; however, in other embodiments, the material comprising microfluidic device 50 may vary. Microfluidic device 50 may generally comprise a microfluidic channel 52 formed thein that is defined by a lower surface or floor 54, a pair of sidewalls 56, and an upper surface or ceiling 58. The microfluidic channel 52 may comprise a length 55 (shown in FIG. 5) extending in the "Y" direction, a width 57 (shown in FIG. 5) extending in the "X" direction, and a height 59 (shown in FIG. 6) extending in the "Z" direction.

The microfluidic channel 52 of device 50 may generally include a first fluid inlet 60, a second fluid inlet 62, a fluid outlet 64, an upstream channel 66, a sloped chamber 68, a pair of parallel collection channels 70, a pair of parallel collection chambers 72, and a downstream channel 74.

While only the pair of fluid inlets 60, 62 and a single fluid outlet 64 are shown in FIGS. 4-6, in other embodiments, microfluidic channel 52 may include varying numbers of fluid inlets and fluid outlets. In some embodiments, microfluidic channel 52 may include components in addition to the components described herein. Each of the fluid inlets 60, 62 of microfluidic device 50 may be coupled to tubing and may be configured to receive one or more fluids. The fluid outlet 64 may be configured to receive a fluid flow that has been transported through the microfluidic channel 52. The fluid flow may exit microfluidic channel 52 via tubing fluidically coupled with fluid outlet 62. Upstream channel 66 may extend from the fluid inlets 60, 62 to the sloped chamber 68 while the downstream channel 74 may extend from the sloped chamber 68 to the fluid outlet 64.

The height 59 of microfluidic channel 52 may vary along the length of channel 52. As shown particularly in FIG. 6, the portion of ceiling 58 associated with sloped chamber 68 may comprise a sloped ceiling 76 whereby the height 59 of sloped chamber 68 may vary along the length of chamber 68 between a minimum height 61 located at an inlet and/or an outlet of sloped chamber 68 and a maximum height 63 spaced (in the "Y" direction) from both the inlet and the outlet of the sloped chamber 68. Particularly, sloped ceiling 76 may slope vertically upwardly gradually increasing the height 59 of sloped chamber 68 moving from the inlet of chamber 68 to a location corresponding to the maximum height 63 of chamber 68. From the location of maximum height 63, the sloped ceiling 76 may slope vertically downwards towards the outlet of sloped chamber 68 which may comprise a location of the minimum height 61 of sloped chamber 61. Thus, unlike the sloped chamber 28 shown in FIGS. 1-3, the sloped ceiling 76 of sloped chamber 68 slopes both vertically upwards and vertically downwards relative to the direction of a fluid flow (indicated schematically by arrows 78 in FIGS. 5, 6) through the microfluidic channel 52. The downward slope of sloped ceiling 76 may minimize dead volume of the sloped chamber 68 and/or mitigate issues that may otherwise be presented by a step-change in the height 59 of sloped chamber 68 at the outlet thereof.

In an embodiment, the minimum height 61 of sloped chamber 68 may be equal to a height of at least a portion of the upstream channel 66 and/or the downstream channel 74 while the maximum height 63 of sloped chamber 68 may comprise a maximum height of the microfluidic channel 52. The sloped ceiling 76 may extend or be disposed at a non-zero angle relative to a horizontal plane extending in the X and Y directions and potentially extending orthogonal the sidewalls 56 of microfluidic channel 52. In some embodiments, sloped ceiling 76 may be curved with radius of curvature that is variable along the length of sloped ceiling 76. For example, sloped ceiling 76 may have a first radius of curvature as ceiling 76 slopes upwards from the inlet of sloped chamber 68 to the location of maximum height 63, and a second radius of curvature as ceiling 76 slopes downwards from the location of maximum height 63 to the outlet of sloped chamber 68.

In an embodiment, sloped chamber 68 of microfluidic channel 52 may comprise an array of spaced (generally in the "X" direction) micropillars 80 which extend from the sloped ceiling 76 at least partially towards the floor 54 of sloped chamber 68. In an embodiment, micropillars 80 may not extend entirely to the floor 54, providing a space underneath of the micropillars 80 for the fluid flow 78 to pass through; however, in other embodiments, the configuration of micropillars 80 may vary. The array of micropillars 80 may be located between the inlet of sloped chamber 68 and the location of maximum height 68 of chamber 68 and thus the plurality of micropillars 80 may extend vertically downward from the portion of sloped ceiling 76 that slopes upwards from the inlet of chamber 68. Additionally, the array of micropillars 80 may extend substantially or entirely across the width 57 of the sloped chamber 68 such that fluid flow 78 is prevented from flowing between (in the "X" direction) the array of micropillars 80 and one of the sidewalls 56 of sloped chamber 68.

During operation of microfluidic device 50, one or more fluids may enter the microfluidic channel 52 of microfluidic device 50 via tubing (not shown in FIGS. 1-3) attached to the fluid inlets 60, 62 of microfluidic channel 52, forming the fluid flow 78 within the channel 52. The fluid flow 78 may comprise a liquid flow such as an aqueous solution or fluorinated oil. Air bubbles may enter the fluid flow as the fluid flow transitions from the tubing to the microfluidic channel 52 and thus may be entrained in the fluid flow 78 as the fluid flows through upstream channel 66. As the fluid flow 78 enters sloped chamber 68, the air bubbles 42, being buoyant in the fluid flow 78, travel upwards along parallel bubble flowpaths (indicated by arrows 82 in FIG. 5) that extend along sloped ceiling 76.

Additionally, the air bubbles flowing through sloped chamber 68 are blocked from reaching the outlet of chamber 68 by the array of micropillars 80. Being buoyant in fluid flow 78, the air bubbles are prevented from flowing underneath micropillars 80 to reach the outlet of sloped chamber 68, and instead the air bubbles are redirected laterally (generally in the "X" direction) along flowpaths 82 towards the collection channels 70 of microfluidic channel 52. The redirected air bubbles may then be collected in the pair of collection chambers 72 of microfluidic channel 52. In an embodiment, a vacuum chamber (not shown in FIGS. 4-6) may be positioned directly above and fluidically coupled to each collection chamber 72 in which a vacuum or negative pressure may be produced (e.g., via a vacuum pump, etc.) to continuously remove the air bubbles collected in the collection chambers 72 of microfluidic channel 52.

In an embodiment, at least a portion of a master mold of microfluidic device 50 may be fabricated using a photolithography process while another portion of the master mold of microfluidic device 50 may be fabricated using a three-dimensional laser fabrication process, such as a 2PP fabrication process. Particularly, fluid inlets 60, 62, fluid outlet 64, upstream channel 66, and downstream channel 70 may each be fabricated using a photolithography process while sloped chamber 68, collection conduits 70, and collection chambers 72 may each be fabricated using a three-dimensional laser fabrication process such as a 2PP fabrication process.

Figure 7:
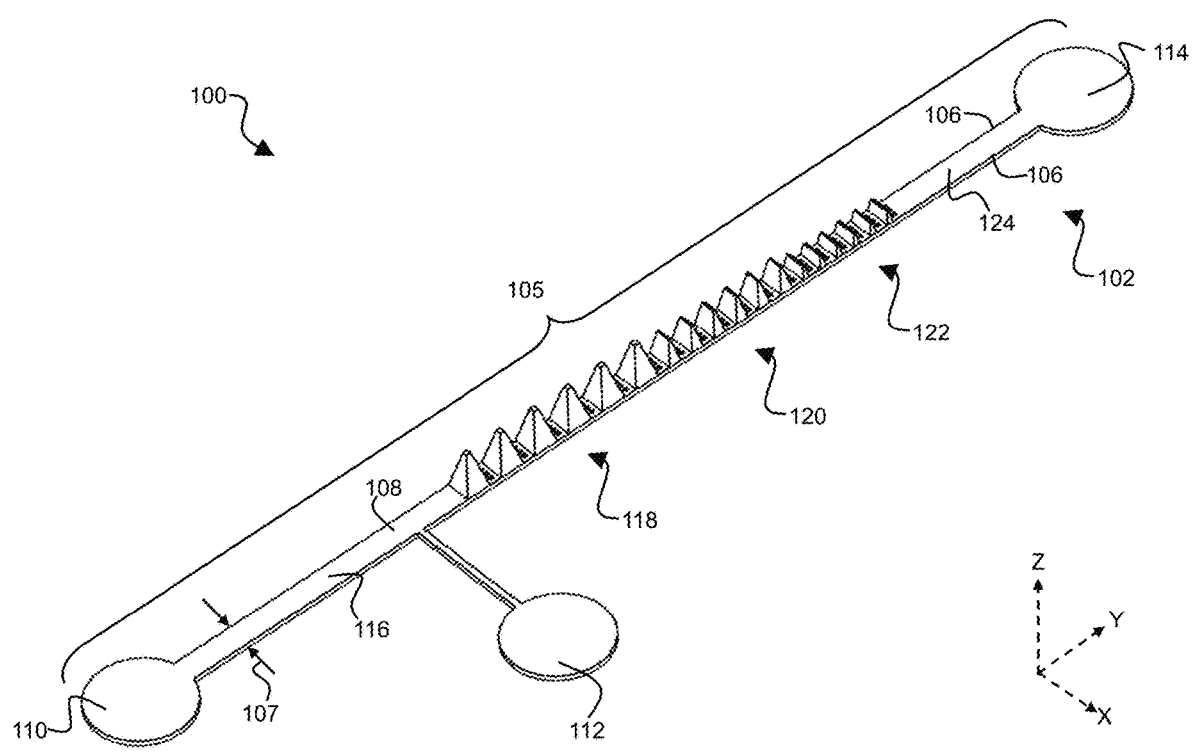
FIG. 7 is a perspective view of another microfluidic device according to some embodiments.
Figure 8:
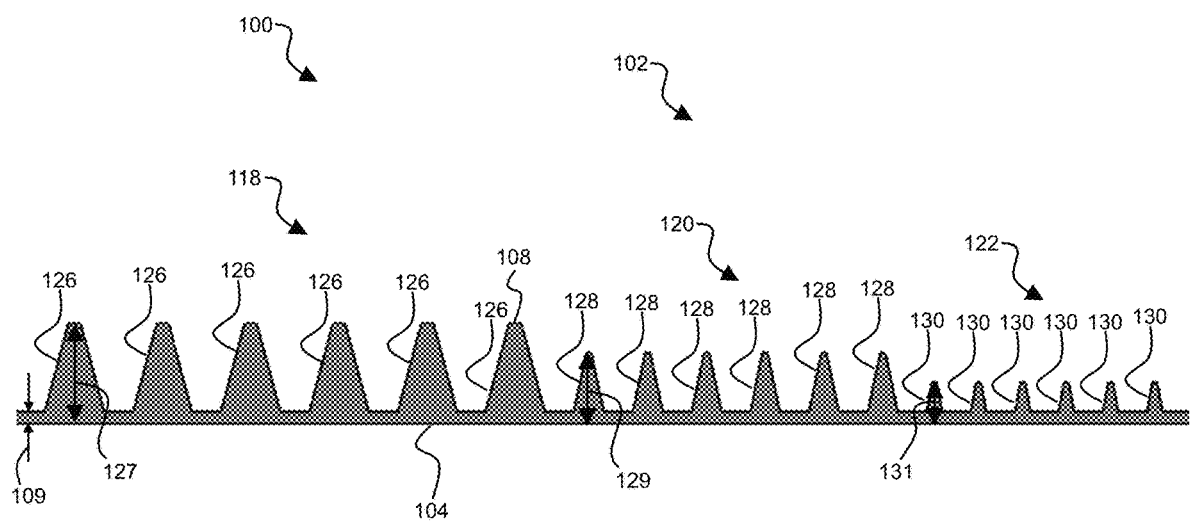
FIG. 8 is a side cross-sectional view of the microfluidic device of FIG. 7.

Referring to FIGS. 7, 8, another microfluidic structure or device 100 is shown. Microfluidic device 100 may comprise a microfluidic air bubble trap and thus may also be referred to herein as air bubble trap 100. As with microfluidic devices 10, 50 shown in FIGS. 1-3 and 4-6, respectively, in an embodiment, the material forming microfluidic device 100 may comprise gas-permeable polydimethyl siloxane (PDMS) membrane; however, in other embodiments, the material comprising microfluidic device 100 may vary. Microfluidic device 100 may generally comprise a microfluidic channel 102 formed therein that is defined by a lower surface or floor 104, a pair of sidewalls 106, and an upper surface or ceiling 108. The microfluidic channel 102 may comprise a length 105 (shown in FIG. 7) extending in the "Y" direction, a width 107 (shown in FIG. 8) extending in the "X" direction, and a height 109 (shown in FIG. 6) extending in the "Z" direction.

The microfluidic channel 102 of device 100 may generally include a first fluid inlet 110, a second fluid inlet 112, a fluid outlet 114, an upstream channel 116, an array or plurality of first sloped chambers 118, an array or plurality of second sloped chambers 120, an array or plurality of third sloped chambers 122, and a downstream channel 124. While only the pair of fluid inlets 110, 112 and a single fluid outlet 114 are shown in FIGS. 7, 8, in other embodiments, microfluidic channel 102 may include varying numbers of fluid inlets and fluid outlets. In some embodiments, microfluidic channel 102 may include components in addition to the components described herein. Each of the fluid inlets 110, 112 of microfluidic device 100 may be coupled to tubing and may be configured to receive one or more fluids. The fluid outlet 114 may be configured to receive a fluid flow that has been transported through the microfluidic channel 102. The fluid flow may exit microfluidic channel 102 via tubing fluidically coupled with fluid outlet 114. The upstream channel 116 may extend from the fluid inlets 110, 112 to the array of first sloped chambers 118 while the downstream channel 124 may extend from the array of third sloped chambers 122 to the fluid outlet 122. Arrays of sloped chambers 118, 120, and 122 may be arranged sequentially with the array of first sloped chambers 118 being positioned directly upstream from the array of second sloped chambers 120, and the array of second sloped chambers 120 being located directly upstream from the array of third sloped chambers 122.

The height 109 of microfluidic channel 102 may vary along the length of channel 102. As shown particularly in FIG. 8, the portion of ceiling 108 associated with each of the array of first sloped chambers 118 may comprise a first sloped ceiling 126 whereby the height 109 of each first sloped chamber 118 may vary along the length of the chamber 118 between a minimum height located at an inlet and/or an outlet of the first sloped chamber 118 and a maximum height 127 (only a single maximum height 127 being indicated in FIG. 8 in the interest of clarity) spaced (in the "Y" direction) from both the inlet and the outlet of the first sloped chamber 118. Particularly, the first sloped ceiling 126 of each first sloped chamber 118 may slope vertically upwardly gradually increasing the height 109 of the sloped chamber 118 moving from the inlet of chamber 118 to a location corresponding to the maximum height 127 of chamber 118. From the location of maximum height 127, the sloped ceiling 126 of each first sloped chamber 118 may slope vertically downwards towards the outlet of first sloped chamber 118 which may comprise a location of the minimum height of chamber 118.

Similarly, the portion of ceiling 108 associated with each of the array of second sloped chambers 120 and third sloped chambers 122 may comprise a second sloped ceiling 128 and a third sloped chamber 130 respectively, whereby the height 109 of each second sloped chamber 120 and each third sloped chamber 122 may vary along the length of the chamber 120, 122 between a minimum height located at an inlet and/or an outlet of the chamber 120, 122 and a maximum height 129, 131, respectively (only a single maximum height 127, 129 being indicated in FIG. 8 in the interest of clarity), spaced (in the "Y" direction) from both the inlet and the outlet of the chamber 120, 122. Particularly, the second sloped ceiling 128 and the third sloped ceiling 130 of each second sloped chamber 120 and third sloped chamber 122, respectively, may slope vertically upwardly gradually increasing the height 109 of the sloped chamber 120, 122 moving from the inlet of chamber 120, 122 to a location corresponding to the maximum height 129, 131 of the chamber 120, 122, respectively. From the location of maximum height 129, 131, the sloped ceiling 128, 130 of each second sloped chamber 120 and third sloped chamber 122, respectively, may slope vertically downwards towards the outlet of the chamber 120, 122 which may comprise a location of the minimum height of the chamber 120, 122. In this configuration, sloped ceilings 126, 128, and 130 may each extend or be disposed at a non-zero angle relative to a horizontal plane extending in the X and Y directions and potentially extending orthogonal the sidewalls 106 of microfluidic channel 102.

In an embodiment, the first sloped ceiling 126 of each first sloped chamber 118 may be pyramid-shaped whereby the width 107 of each first sloped chamber 118 may decrease moving from the inlet/outlet of the first sloped chamber 118 to the location of maximum height 127. However, each sloped ceiling 128, 130 of the plurality of sloped chambers 120, 122, respectively, may be wedge-shaped whereby each sloped chamber 120, 122 has a constant or fixed width 107. Additionally, the maximum height 127 of each first sloped chamber 118 may be greater than the maximum height 129 of each second sloped chamber 128 of microfluidic channel 102. Further, the maximum height 129 of each second sloped chamber 128 may be greater than the maximum height 131 of each third sloped chamber 122 of microfluidic channel 102. Thus, the maximum heights 127, 129, 131 of sloped chambers 118, 120, and 122 may generally decrease moving downstream from first sloped chambers 118 to the third sloped chambers 122.

In this configuration, air bubbles having a relatively large diameter may be captured in the plurality of first sloped chambers 118 while air bubbles having relatively smaller diameters may be captured in the plurality of second sloped chambers 120 of microfluidic channel 102. Air bubbles of even smaller diameter may be captured in the plurality of third sloped chambers 122 of microfluidic channel 102. In an embodiment, a vacuum chamber (not shown in FIGS. 7, 8) may be positioned directly above and fluidically coupled to each sloped chamber 118, 120, and 122 in which a vacuum or negative pressure may be produced (e.g., via a vacuum pump, etc.) to continuously remove the air bubbles collected in the sloped chambers 118, 120, and 122 of microfluidic channel 102.

In an embodiment, at least a portion of a master mold of microfluidic device 100 may be fabricated using a photolithography process while another portion of the master mold of microfluidic device 100 may be fabricated using a three-dimensional laser fabrication process, such as a 2PP fabrication process. Particularly, fluid inlets 110, 112, fluid outlet 114, upstream channel 116, and downstream channel 124 may each be fabricated using a photolithography process while each of the sloped chamber 118, 120, and 122 may be fabricated using a three-dimensional laser fabrication process such as a 2PP fabrication process.

Figure 9:
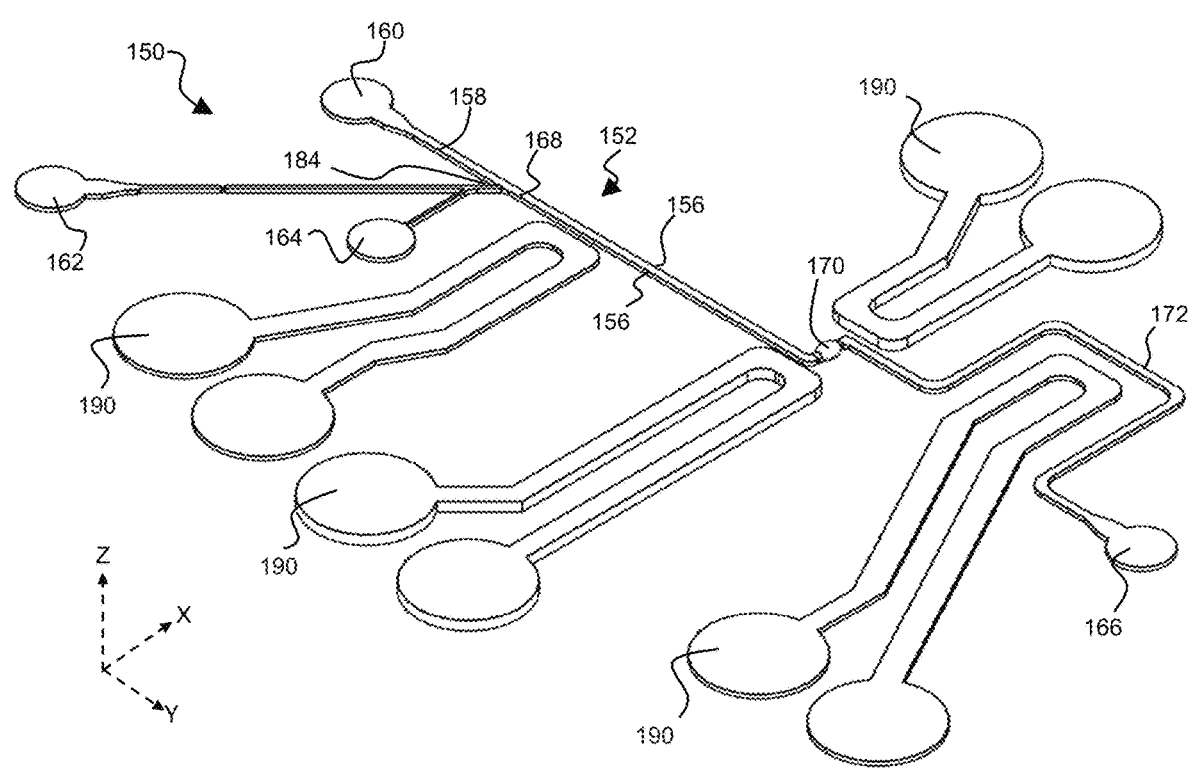
FIG. 9 is a perspective view of another microfluidic device according to some embodiments.
Figure 10:
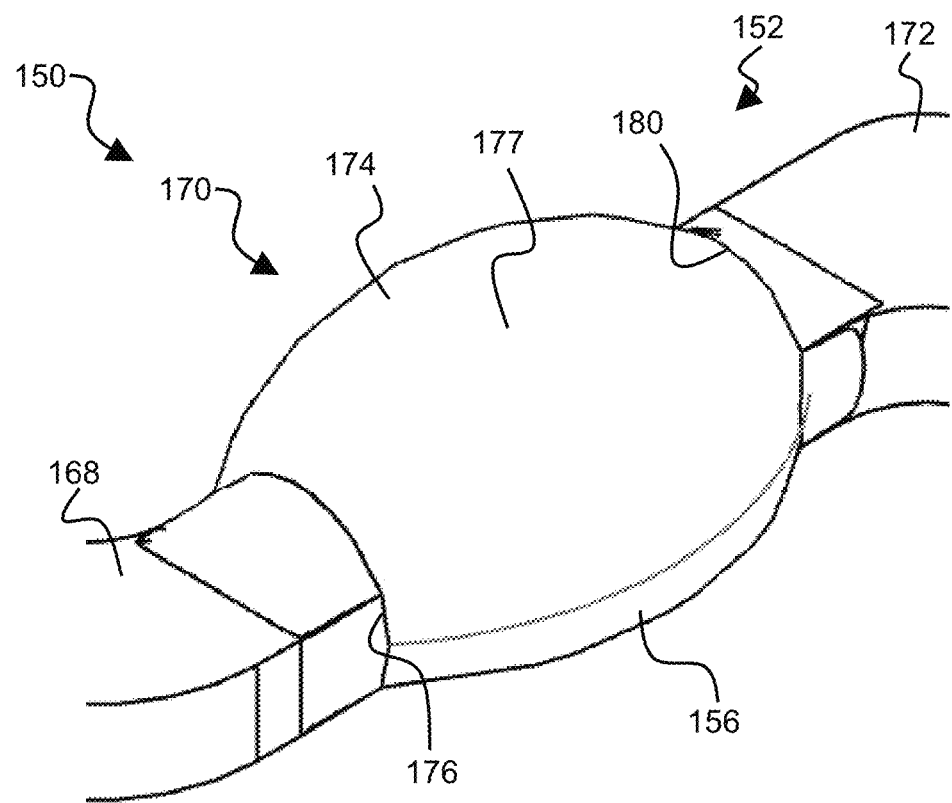
FIG. 10 is a perspective view of a droplet merging chamber of the microfluidic device of FIG. 9 according to some embodiments.
Figure 11:
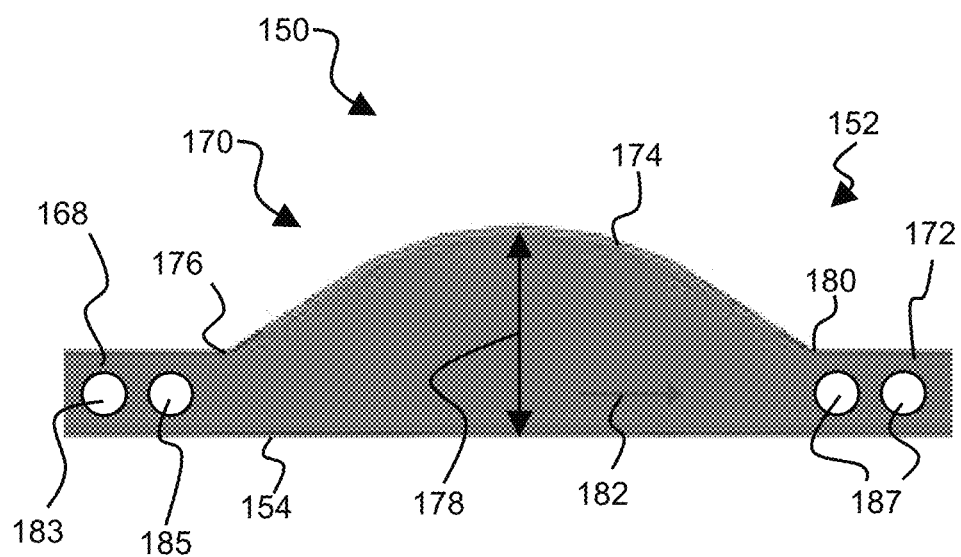
FIG. 11 is a side cross-sectional view of the droplet merging chamber of FIG. 10.

As described above, sloped microfluidic channels may be employed in microfluidic devices for purposes other than for the collection and/or removal of air bubbles entrained within a fluid flow. Referring to FIGS. 9-11, another microfluidic structure or device 150 is shown that employs a sloped microfluidic channel to allow for the manipulation of droplets without rupturing and/or merging the droplets. Particularly, microfluidic device 150 may comprise a microfluidic channel 152 formed therein that is defined by a lower surface or floor 154, a pair of sidewalls 156, and an upper surface or ceiling 158. The microfluidic channel 152 may comprise a length extending in the "Y" direction, a width 153 (shown in FIG. 9) extending in the "X" direction, and a height 155 (shown in FIG. 11) extending in the "Z" direction. In an embodiment, the material forming microfluidic device 150 may comprise gas-permeable PDMS membrane; however, in other embodiments, the material comprising microfluidic device 150 may vary. Microfluidic device 150 may additionally comprise a plurality of electrodes 200 disposed therein and positioned on each side of microfluidic channel 152. In an embodiment, each electrode 190 may comprise a three-dimensional electrode.

The microfluidic channel 152 of microfluidic device 150 may generally include a plurality of fluid inlets 160, 162, and 164, a fluid outlet 166, an upstream channel 168, a sloped droplet merging chamber 170, and a downstream channel 172. While only the fluid inlets 160, 162 164, and a single fluid outlet 166 are shown in FIGS. 9-11, in other embodiments, microfluidic channel 152 may include varying numbers of fluid inlets and fluid outlets. In some embodiments, microfluidic channel 152 may include components in addition to the components described herein. Each of the fluid inlets 160, 162, and 164 of microfluidic device 150 may be coupled to tubing and may be configured to receive one or more fluids. The fluid outlet 166 of channel 150 may be configured to receive a fluid flow that has been transported through the microfluidic channel 152. The fluid flow may exit microfluidic channel 152 and device 150 via tubing fluidically coupled with fluid outlet 166. Upstream channel 168 may extend from the fluid inlets 160, 162, and 164 to the droplet merging chamber 170 while the downstream channel 172 may extend from the droplet merging chamber 170 to the fluid outlet 166.

The width 153 and height 155 of microfluidic channel 152 may each vary along the length of channel 152. As shown particularly in FIGS. 10, 11, droplet merging chamber 170 of microfluidic channel 152 may be football-shaped and the portion of ceiling 158 associated with droplet merging chamber 170 may comprise a sloped ceiling 174 having a convex curvature whereby the height 155 of droplet merging chamber 170 may vary along the length of chamber 170 between a minimum height located at an inlet 176 of chamber 170 and a location 177 (located in the center of droplet merging chamber 170 in this embodiment) of a maximum height 178 that is spaced from both the inlet 176 and an outlet 180 of the droplet merging chamber 170. Particularly, sloped ceiling 174 may slope vertically upwardly gradually increasing the height 155 of droplet merging chamber 170 moving from the inlet 176 of chamber 170 to the location 177 corresponding to the maximum height 178 of chamber 170. From the location 177 of maximum height 178, the sloped ceiling 174 may slope vertically downwards towards the outlet 180 of droplet merging chamber 170. Additionally, sloped ceiling 174 of droplet merging chamber 170 may be sloped from each sidewall 156 of chamber 170 to the location 177 of maximum height 178 whereby the width 155 of droplet merging chamber 170 may gradually be reduced moving from the floor 154 to the sloped ceiling 174 of chamber 170.

The droplet merging chamber 170 may be positioned directly between a pair of opposed electrodes 190 of microfluidic device 150. The pair of electrodes 190 may be configured to apply an electric field to a fluid flow (indicated by arrow 182 in FIG. 11) in droplet merging chamber 170.

During operation of microfluidic device 150, a first fluid may be supplied to the first fluid inlet 160 of microfluidic channel 152 via tubing (not shown in FIGS. 9-11) fluidically coupled to the first fluid inlet 160 while a second fluid may be supplied to the second fluid inlet 160 via tubing (not shown in FIGS. 9-11) fluidically coupled to the second fluid inlet 162. The first fluid may comprise a first aqueous solution comprising a plurality of first droplets 183 while the second fluid may comprise a second aqueous solution that, when combined with the first aqueous solution at a junction 184 of microfluidic channel 152, may form a second plurality of droplets 185 in the fluid flow 182, where the first droplets 183 have a composition that differs from a composition of the second droplets 185.

As the fluid flow 182 comprising droplets 183, 185 enter droplet merging chamber 170 the pair of electrodes positioned adjacent chamber 170 may apply an electric field to the fluid flow 182 thereby merging droplets 183, 185 into a plurality of combined or merged droplets 187 which exit the outlet 180 of droplet merging chamber 170. In some applications, it may be advantageous to increase a height of a droplet merging chamber relative to the heights of upstream and downstream channels to enhance the efficacy of the droplet merging operation. For example, increasing a height of a droplet merging chamber induces a local decrease in droplet flow rate, thus allowing the droplets 183, 185 to be merged to come into close and/or direct contact to each other for the completion of merging droplets 183, 185, thereby increasing the efficiency/accuracy of droplet merging event. Additionally, it may be advantageous to minimize abrupt changes of direction in the fluid flow 182 to thereby minimize the shear stresses (abrupt changes in direction being associated with high level of shear stress) applied to droplets 183, 185, and 187 to avoid potentially rupturing droplets 183, 185, and 187 during and/or following the process of merging droplets 183, 185 to produce merged droplets 187.

In the instant embodiment, the sloped ceiling 174 of droplet merging chamber 170 gradually reduces the height 155 of droplet merging chamber 170 from the maximum height 178 to minimum height at the outlet 180 of droplet merging chamber 170. In this configuration, droplets (e.g., merged droplets 187) may be guided gradually, rather than abruptly, downwards along the sloped ceiling 174 of droplet merging chamber 170 to the outlet 180 of droplet merging chamber 170, thereby minimizing the shear stress applied to merged droplets 187 as they flow from chamber 170 to the downstream channel 172. By minimizing the shear stress applied to merged droplets 187 through gradually changing the direction of merged droplets 187 through droplet merging chamber 170, the probability of any given merged droplet 187 being destroyed may be minimized, thereby increasing the success rate in merging droplets 183, 185 to produce merged droplets 187. After exiting droplet merging chamber 170, the merged droplets 187 may be analyzed and/or additional manipulations may be performed onto merged droplets 187.

In an embodiment, at least a portion of a master mold of microfluidic device 150 may be fabricated using a photolithography process while another portion of the master mold of microfluidic device 150 may be fabricated using a three-dimensional laser fabrication process, such as a 2PP fabrication process. Particularly, fluid inlets 160, 162, 164, fluid outlet 166, upstream channel 168, and downstream channel 172 may each be fabricated using a photolithography process while droplet merging chamber 170 may be fabricated using a three-dimensional laser fabrication process such as a 2PP fabrication process.

Figure 12:
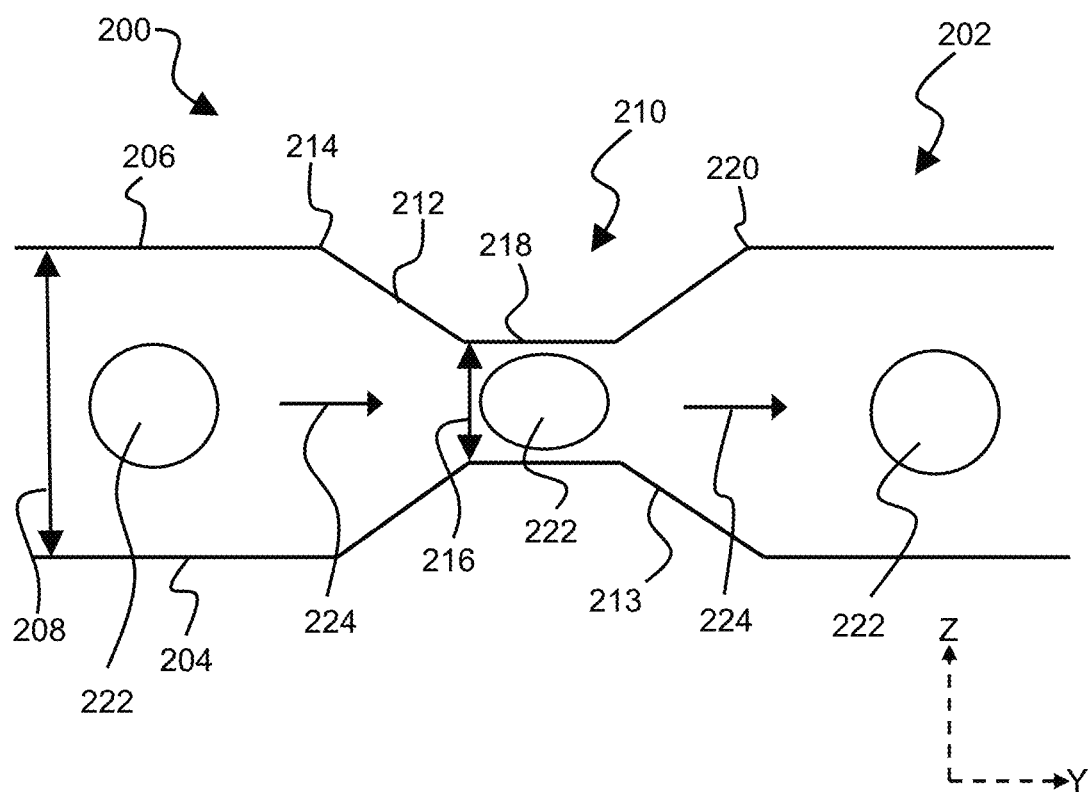
FIG. 12 is a side cross-sectional view of another microfluidic device according to some embodiments.

Referring to FIG. 12, another microfluidic structure or device 200 is shown that also employs a sloped microfluidic channel to allow for the manipulation of droplets without rupturing and/or merging the droplets. Particularly, microfluidic device 200 may comprise a microfluidic channel 202 formed therein that is defined by a lower surface or floor 204, a pair of sidewalls (not shown in FIG. 12), and an upper surface or ceiling 206. The pair of sidewalls may extend vertically between the floor 204 and ceiling 206 and microfluidic channel 202 may have a generally rectangular cross-sectional area. The microfluidic channel 202 may comprise a length extending in the "Y" direction, a width extending in the "X" direction (not shown in FIG. 12), and a height 208 extending in the "Z" direction.

The height 208 of microfluidic channel 202 may vary along the length of channel 202. Particularly, the portion of ceiling 206 associated with a sloped, droplet compression chamber 210 of microfluidic channel 202 may comprise a sloped ceiling 212 while a portion of the floor 204 associated with droplet compression chamber 210 may comprise a sloped floor 213. In an embodiment, sloped ceiling 212 and sloped floor 213 may each be sloped linearly at a non-zero angle relative to a horizontal plane extending orthogonal the sidewalls of microfluidic channel 202. In other embodiments, sloped ceiling 212 and sloped floor 213 may each be curved at a fixed or variable radius of curvature. In an embodiment, only the ceiling 212 or floor 213 of droplet compression chamber 210 may be sloped (the other being horizontal).

In this configuration, the height 208 of droplet compression chamber 210 may vary along the length of droplet compression chamber 210 between a height 208 at an inlet 214 of chamber 210 to a minimum height 216 at a location 218 that is spaced from the inlet 214, the minimum height 216 being less than the height 208 of chamber 210 at the inlet 214. Particularly, from the inlet 214, the sloped ceiling 212 may extend vertically downwards while the sloped floor 213 may extend vertically upwards gradually reducing the height 208 of droplet compression chamber 210 until the location 218 of minimum height 216 is reached. From the location 218 of minimum height 216, the sloped ceiling 212 may extend vertically upwards while the sloped floor 213 extends vertically downwards gradually increasing the height 208 of droplet compression chamber 210 from the minimum height 216 until the droplet compression chamber 210 terminates at an outlet 220 of the chamber 210. In an embodiment, the height 208 of droplet compression chamber 210 at the outlet 220 thereof may be equal to the height 208 of chamber 210 at the inlet 214 thereof.

The droplet compression chamber 210 of microfluidic device 200 may be generally configured to deform or squeeze a droplet 222 flowing within a fluid flow (indicated by arrow 224 in FIG. 12) whereby a height of the droplet 222 is reduced as the droplet 222 flows through the droplet compression chamber 210. Particularly, during operation of microfluidic device 200, the fluid flow 224 comprising droplet 222 may enter the inlet 214 of droplet compression chamber 210 whereby the droplet 222 is gradually (rather than abruptly) compressed or squeezed as the droplet 222 interacts with the sloped ceiling 212 and sloped floor 213 of the droplet compression chamber 210 until the droplet 222 reaches a compressed condition within the location 218 of minimum height 216. In the compressed condition, the droplet 222 may be examined by an instrument or sensor positioned adjacent the droplet compression chamber 210. In some applications, for example, compressing the droplet 222 may make certain features of droplet 222 easier to observe by an instrument positioned adjacent droplet compression chamber 210.

Droplet 222 may gradually expand after exiting the location 218 of minimum diameter 217 as the height 208 of droplet compression chamber 210 gradually increased from the minimum diameter 216 until the droplet 222 exits the droplet compression chamber 210 at outlet 220. In this manner, droplet 222 may be gradually compressed from an initial configuration to a compressed condition, and then gradually released from the compressed condition to the initial condition. By gradually, rather than abruptly, transitioning the droplet 222 between the initial and compressed conditions, the droplet compression chamber 210 may minimize the shear stress applied to droplet 222 during the transition between the initial and compressed conditions. By minimizing the shear stress applied to droplet 222, droplet compression chamber 210 may minimize the probability that a given droplet 222 will rupture as it is transitioned between the initial and compressed conditions.

Figure 13:
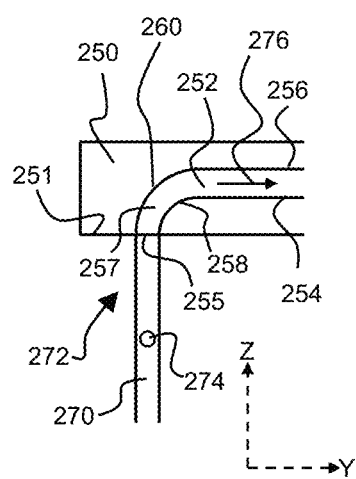
FIG. 13 is a side cross-sectional view of another microfluidic device according to some embodiments.

Referring to FIG. 13, another microfluidic structure or device 250 is shown that also employs a sloped microfluidic channel to allow for the manipulation of droplets without rupturing and/or merging the droplets during, for example, layer-to-layer microfluidic device transition, and/or to allow for the manipulation of droplets without changing the droplet-to-droplet distances. Particularly, microfluidic device 250 may comprise a microfluidic channel 252 formed therein that is defined by a lower surface or floor 254, and an upper surface or ceiling 256. microfluidic channel 202 may comprise a length extending in the "Y" direction, a width extending in the "X" direction (not shown in FIG. 13), and a height extending in the "Z" direction.

The microfluidic channel 252 may comprise a fluid inlet 252 formed on an external surface 251 of the microfluidic device 250 and a sloped channel or chamber 257 extending from the fluid inlet 252. In an embodiment, the sloped chamber 257 may comprise a ninety-degree bend. A vertically extending fluid conduit or chamber 270 may fluidically connect to the fluid inlet 255 of microfluidic channel 252. In an embodiment, fluid conduit 270 and the junction formed between fluid conduit 270 and fluid inlet 255 of microfluidic channel 252 may form a vertical tubing-to-channel junction 272. In another embodiment, fluid conduit 270 may comprise a vertically extending chamber of the microfluidic device 250 and the junction formed between fluid inlet 255 and fluid conduit 270 may form a vertical chamber-to-channel junction 272.

The floor 254 of microfluidic channel 252 associated with sloped chamber 257 may comprise a sloped floor 258 while the ceiling 256 of microfluidic channel 252 associated with sloped chamber 257 may comprise a sloped ceiling 260. The sloped floor 258 and sloped ceiling 260 may each extend at a non-zero angle (e.g., an acute angle) relative to a horizontal plane extending in the "X" and "Y" directions. In an embodiment, sloped floor 258 and sloped ceiling 260 may each be curved along either a fixed or a variable radius of curvature. In other embodiments, at least one of the sloped floor 258 and the sloped ceiling 260 may be sloped linearly relative to the horizontal plane.

Having a sloped floor 258 and sloped ceiling 260, a droplet 274 suspended in a fluid flow (indicated by arrow 276 in FIG. 13) may gradually transition from travelling in a substantially vertical direction (i.e., in the "Z" direction) as the droplet 274 travels upwards through fluid conduit 270 to a substantially horizontal direction (i.e., in the "Y" direction) as the droplet enters and flows through the microfluidic channel 252 of microfluidic device 250. In this manner, by gradually rather than abruptly changing the direction of travel of droplet 274 from a vertical to a horizontal direction, the acceleration and resulting forces applied to droplet 274 may be minimized, thereby minimizing the probability of the droplet 274 rupturing as it transitions between the fluid conduit 270 and the microfluidic channel 252 of microfluidic device 250.

Figure 14:
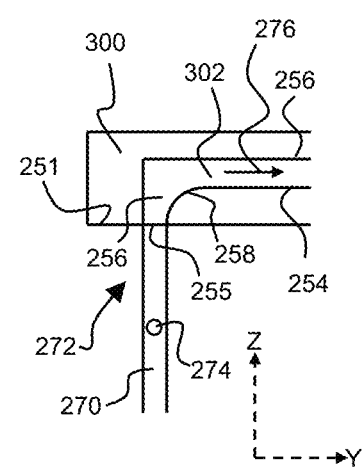
FIG. 14 is a side cross-sectional view of another microfluidic device according to some embodiments.

Referring to FIG. 14, another microfluidic structure or device 300 is shown that also employs a sloped microfluidic channel to allow for the manipulation of droplets without rupturing and/or merging the droplets, and/or to allow for the manipulation of droplets without changing the droplet-to-droplet distances. Microfluidic device 300 may share features in common with the microfluidic device 250 shown in FIG. 12, and shared features are labeled similarly. Particularly, microfluidic device 300 comprises a microfluidic channel 302 which is similar to the microfluidic channel 252 shown in FIG. 12 except that a sloped conduit or chamber 304 of microfluidic channel 302 comprises only the sloped floor 258, and does not comprise sloped ceiling 260. In another embodiment, sloped chamber 304 may only sloped ceiling 260 rather than sloped floor 258.

Figure 15:
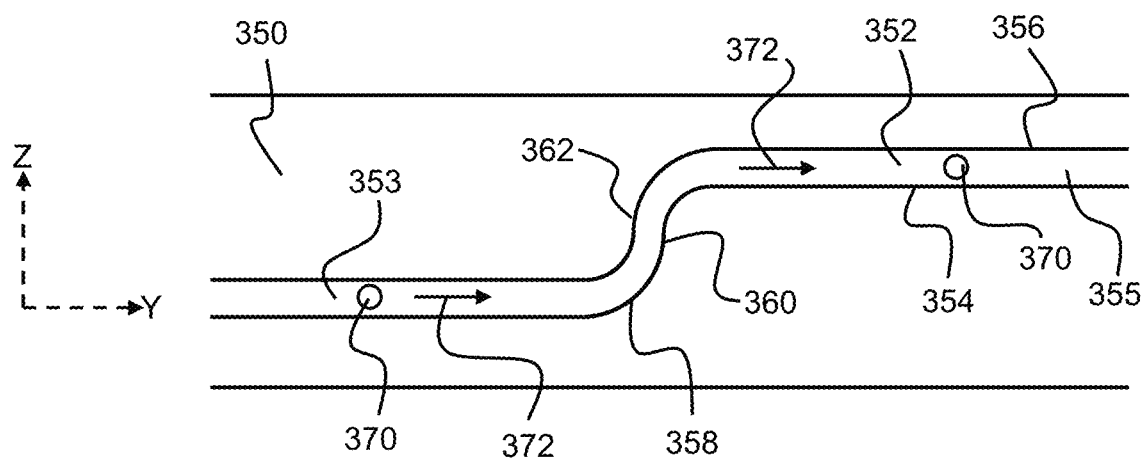
FIG. 15 is a side cross-sectional view of another microfluidic device according to some embodiments.

Referring to FIG. 15, another microfluidic structure or device 350 is shown that also employs a sloped microfluidic channel to allow for the manipulation of droplets without rupturing and/or merging the droplets. Particularly, microfluidic device 350 may comprise a microfluidic channel 352 formed therein that is defined by a lower surface or floor 354, and an upper surface or ceiling 356. Microfluidic channel 352 may comprise a length extending in the "Y" direction, a width extending in the "X" direction (not shown in FIG. 15), and a height extending in the "Z" direction.

In an embodiment, microfluidic channel 352 may comprise a horizontal upstream channel 353, a horizontal downstream channel 355, and a sloped chamber or channel 358 extending between the upstream channel 353 and downstream channel 355. The floor 354 of microfluidic channel 352 associated with sloped chamber 358 may comprise a sloped floor 360 while the ceiling 356 associated with sloped chamber 358 may comprise a sloped ceiling 362. In an embodiment, sloped floor 360 and sloped ceiling 362 of sloped chamber 358 may each be an S-shaped curve whereby a droplet 370 suspended in a fluid flow (indicated by arrows 372 in FIG. 15) may make a vertically extending transition or displacement between the upstream channel 353 and the downstream channel 355. In this manner, by gradually rather than abruptly changing the direction of travel of droplet 370 from a first horizontal direction to a vertical direction, and from the vertical direction to a second horizontal direction that is vertically spaced from the first horizontal direction, the acceleration and resulting forces applied to droplet 370 may be minimized, thereby minimizing the probability of the droplet 370 rupturing as it transitions from the upstream channel 353 to the downstream channel 355.

Figure 16:
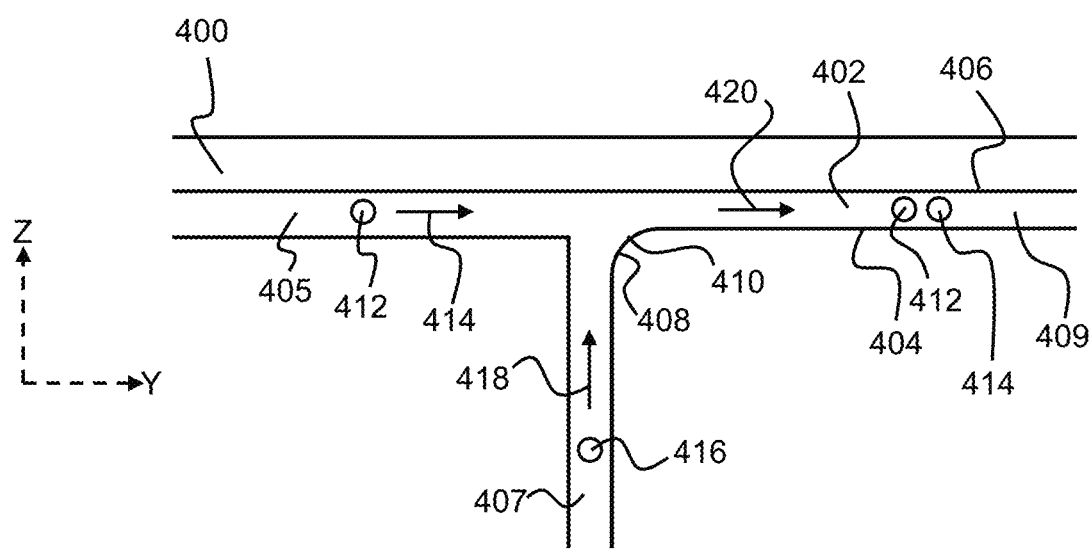
FIG. 16 is a side cross-sectional view of another microfluidic device according to some embodiments.

Referring to FIG. 16, another microfluidic structure or device 400 is shown that also employs a sloped microfluidic channel to allow for the manipulation of droplets without rupturing and/or merging the droplets. Particularly, microfluidic device 400 may comprise a microfluidic channel 402 formed therein that is defined by a lower surface or floor 404, and an upper surface or ceiling 406. Microfluidic channel 402 may comprise a length extending in the "Y" direction, a width extending in the "X" direction (not shown in FIG. 16), and a height extending in the "Z" direction.

In an embodiment, microfluidic channel 402 may comprise a horizontal inlet channel 405, a vertical inlet channel 407, a sloped chamber or channel 408, and a horizontal outlet channel 409. The floor 409 of microfluidic channel 402 associated with sloped chamber 408 may comprise a sloped floor 410 that extends at a non-zero angle (e.g., an acute angle) relative to a horizontal plane. In an embodiment, sloped floor 408 of sloped chamber 408 may each be curved and have either a fixed or a variable radius of curvature; however, in other embodiments, sloped floor 408 may be sloped linearly relative to the horizontal plane.

During operation of microfluidic device 400, a first droplet 412 may be suspended in a first fluid flow 414 travelling through horizontal upstream channel 405 while a second droplet 416 suspended in a second fluid flow (indicated by arrow 418 in FIG. 16) travels through vertical upstream channel 407. Sloped chamber 408 provides a junction in which first droplet 412 and second droplet 416 may interact and travel in concert in the horizontal outlet channel 409 while suspended in a third fluid flow 420 which combines the first fluid flow 414 and the second fluid flow 418. During this process, the second droplet 416 must transition from travelling in a vertical direction in vertical upstream channel 407 to a horizontal direction in horizontal outlet channel 409. Given that sloped chamber 408 comprises curved floor 410, the second droplet 416 gradually changes direction (transitioning from vertical travel to horizontal travel) as it flows through sloped chamber 408, thereby minimizing the acceleration and corresponding forces applied to the second droplet 416. By minimizing the forces applied to second droplet 416 as it flows through sloped chamber 408, a probability of the second droplet 416 inadvertently rupturing or merging with first droplet 412 as the second droplet 416 flows through sloped chamber 408 may be minimized, thereby maximizing an efficiency of the junction formed by sloped chamber 408.

Figure 17:
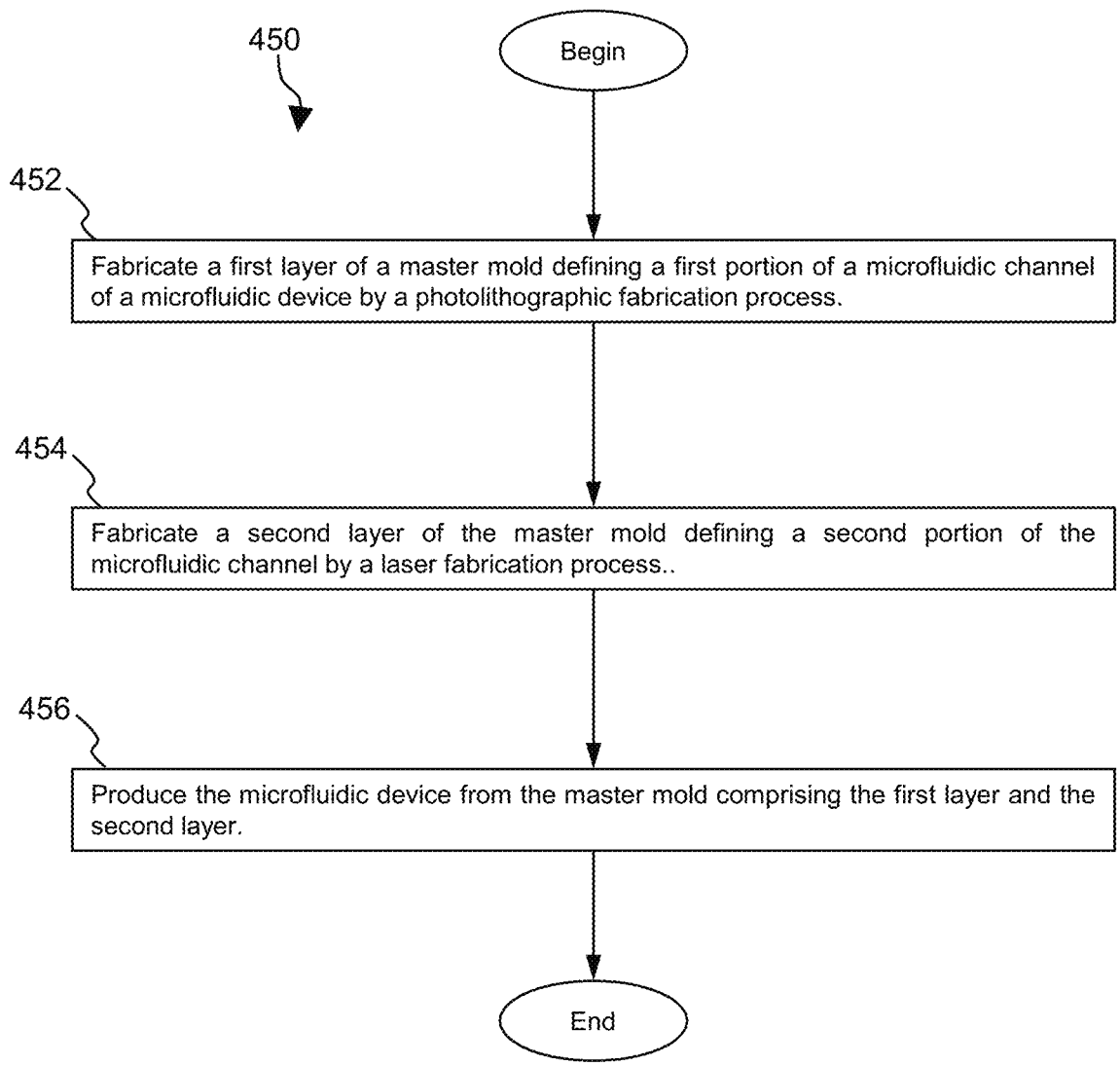
FIG. 17 is a flowchart of a method for fabricating a microfluidic device according to some embodiments.

Referring to FIG. 17, a flowchart illustrating a method 450 for fabricating a microfluidic device comprising sloped microfluidic channel is shown. Initially, block 452 of method 450 comprises fabricating a first layer of the master mold defining a first portion of the microfluidic channel by a photolithographic fabrication process. For example, referring briefly to FIG. 3, a first portion 35 of microfluidic channel 12 of microfluidic device 10 may be defined by a first layer of the master mold that may be produced by a photolithographic fabrication process.

Referring again to FIG. 17, at block 454, method 450 comprises fabricating a second layer of the master mold defining a second portion of the microfluidic channel by a laser fabrication process. For example, referring briefly again to FIG. 3, a second portion 37 of microfluidic channel 12 of microfluidic device 10 may be defined by a second layer of the master mold that may be produced by a laser fabrication process. Referring back to FIG. 17, the second portion of the microfluidic channel may comprise sloped chamber or channel comprising at least one of a vertically sloped floor and a vertically sloped ceiling. In some embodiments, the laser fabrication process may comprise a 2PP fabrication process. Although in this embodiment the "first layer" of the master mold is produced by a photolithographic fabrication process while the "second layer" is produced by the laser fabrication process, in other embodiments, the "first layer" may be produced by the laser fabrication process while the "second layer" may be produced by the photolithographic fabrication process. In still other embodiments, the master mold of the microfluidic device may comprise additional layers produced through a photolithographic fabrication process and/or a laser fabrication process.

At block 456, method 450 comprises producing the microfluidic device from the master mold comprising the first layer and the second layer. For example, referring to FIGS. 1-3, microfluidic device 10 may be produced from a master mold comprising a first layer defining the first portion 35 of microfluidic channel 12 and a second layer defining the second portion 37 of microfluidic channel 12, where the second portion 37 is formed or positioned directly above the first portion 35.

Particularly, the fluid inlets 20, 22, fluid outlet 24, upstream channel 26, and downstream channel 30 of the master mold, each having a fixed or constant height 19, may be fabricated using a photolithography fabrication process while sloped chamber 28 of the master mold, having a variable height 19, may be fabricated using a three-dimensional fabrication process, such as a 2PP fabrication process, which allows for the laser printing of microfluidic structures with sub-μm resolution. Specifically, in a 2PP fabrication process, laser pulses may be directed towards a volume of photosensitive material (e.g., a photoresist) thereby causing layer-by-layer polymerization in the photosensitive material. Once a desired three-dimensional structure (e.g., sloped channel 28) has been polymerized, the remaining material may be removed to provide the finished structure. The sloped channel 28 of the master mold may be fabricated using a commercially available 2PP fabrication instrument. For example, in an embodiment, sloped channel 28 of the master mold may be fabricated using the "Photonic Professional GT" instrument (Nanoscribe GmbH, Germany); however, other three-dimensional fabrication instruments may be employed to form the sloped channel 28 of the master mold.

In an exemplary process for fabricating the sloped channel 28 of a master mold, an approximately four inch silicon wafer was pretreated to ensure enhanced adhesion of a photoresist to a substrate. The wafer was then submerged into solution containing approximately 1% (v/v) 3-(trimethoxsilyl)propyl methacrylate (440159, Sigma-Aldrich, USA) diluted into approximately 25 milli-liters (mL) of ethanol for approximately ten hours. The wafer was then washed in distilled water and dried using a nitrogen gun. Next, a three-dimensional computer aided drawing (CAD) was prepared using "Solidworks 2018" (Dassault Systemes SolidWorks Corp, MA) and transcribed for writing using "Describe" (Nanoscribe GmbH, Germany) and uploaded onto the Photonic Professional GT instrument. The master mold was then fabricated out of a "IP-S negative photoresist" (Nanoscribe GmbH, Germany) using a 25× objective print field at a power scaling of 1.0, a tetrahedron inner scaffold, base scan speeds of approximately 50,000, a base laser power of approximately 60%, shell/scaffold scan speeds of approximately 100,00, and shell/scaffold laser power intensities set at approximately 70%.

In this exemplary fabrication process, following printing, the unpolymerized resist was developed in propylene glycol monoethyl ether acetate (PGMEA, Millipore Sigma, Mass.) for approximately six minutes followed by an approximately ten minute fine development step in approximately 99% Isopropyl alcohol (IPA, VWR, PA). The patterned master mold was then coated with (tridecafluoro-1,1,2,2 tetrahydrooctyl) trichlorosilane (United Chemical Technologies, Inc., Bristol, Pa.) to enhance PDMS release. A PDMS mixture (1:10, Dow Sylgard 184) was then poured on the 2PP-fabricated master mold, cured at approximately 85° C. for approximately four hours, released from the master mold, and then bonded on a glass substrate following oxygen plasma treatment. PDMS was poured only up to slightly above the master mold height, resulting in the sloped chamber 28 having only a 300 μm thick ceiling 18 (comprising PDMS) at the location of maximum height 23. Finally, a vacuum chamber 34 having a surface area of approximately 4.4 millimeters squared was bonded on top of the sloped chamber 28 to allow for the application of vacuum pressure through the thin ceiling 18 for air bubble removal. The microfabricated 2PP master mold was then sputter-coated with a thin gold layer, and the microstructures were examined with SEM (TESCAN MIRA3).

While embodiments of the disclosure have been shown and described, modifications thereof can be made by one skilled in the art without departing from the scope or teachings herein. The embodiments described herein are exemplary only and are not limiting. Many variations and modifications of the systems, apparatus, and processes described herein are possible and are within the scope of the disclosure. For example, the relative dimensions of various parts, the materials from which the various parts are made, and other parameters can be varied. Accordingly, the scope of protection is not limited to the embodiments described herein, but is only limited by the claims that follow, the scope of which shall include all equivalents of the subject matter of the claims. Unless expressly stated otherwise, the steps in a method claim may be performed in any order. The recitation of identifiers such as (a), (b), (c) or (1), (2), (3) before steps in a method claim are not intended to and do not specify a particular order to the steps, but rather are used to simplify subsequent reference to such steps.

What is claimed is:

1. A microfluidic device, comprising:
   a vacuum chamber defined by a gas permeable membrane; and
   a microfluidic channel formed in the microfluidic device and defined by a floor and a ceiling positioned vertically above the floor, wherein the microfluidic channel is in communication with the vacuum chamber;
   wherein the microfluidic channel comprises at least one fluid inlet configured to receive a fluid flow and at least one fluid outlet; and
   wherein the ceiling of the microfluidic channel is sloped relative to both a horizontal plane and the floor in the direction of the permeable membrane whereby the sloped ceiling is configured to direct one or more air bubbles suspended in the fluid flow towards the permeable membrane to form an air bubble trap of the microfluidic device.

2. The microfluidic device of claim 1, wherein at least one of the ceiling or the floor is curved.

3. The microfluidic device of claim 1, wherein:
   the sloped microfluidic channel defines a sloped chamber and the microfluidic device further comprises:
   a vacuum chamber located above the sloped chamber; and
   a vacuum pump configured to apply a negative pressure to the vacuum chamber located vertically above the sloped chamber whereby one or more air bubbles accumulated in the sloped chamber are transported through a ceiling of the sloped chamber and into the vacuum chamber.

4. The microfluidic device of claim 1, wherein:
   the microfluidic channel defines a sloped chamber and the microfluidic device further comprises:
   a pair of collection channels extending from the sloped chamber; and
   a pair of collection chambers extending from the pair of collection channels and configured to collect air bubbles therein;
   wherein the sloped chamber comprises an array of micropillars extending downwards from a ceiling of the sloped chamber and wherein the array of micropillars are configured to prevent air bubbles from travelling between an inlet and an outlet of the sloped chamber.

5. The microfluidic device of claim 1, wherein the microfluidic channel defines:
an array of the first sloped chambers;
an array of second sloped chambers positioned in series with the array of first sloped chambers;
an array of third sloped chambers positioned in series with both the array of first sloped chambers and the array of second sloped chambers; and
wherein a maximum height of each of the array of first sloped chambers is greater than a maximum height of each of the array of second sloped chambers, and the maximum height of each of the array of second sloped chambers is greater than a maximum height of each of the array of third sloped chambers.

6. The microfluidic device of claim 1, wherein the microfluidic channel comprises a droplet merging chamber whereat the ceiling of the microfluidic has a convex curvature.

7. The microfluidic device of claim 1, wherein:
the fluid inlet of the microfluidic channel is positioned at an external surface of the microfluidic device:
the microfluidic channel comprises a sloped chamber extending from the fluid inlet, the sloped chamber comprising a ninety-degree bend and wherein the floor associated with the sloped chamber is sloped relative to the horizontal plane.

8. The microfluidic device of claim 1, wherein the microfluidic channel comprises a droplet compression chamber and wherein the ceiling of the microfluidic chamber associated with the droplet compression chamber slopes relative to the horizontal plane from a first height at an inlet of the droplet compression chamber to a reduced height of the droplet compression chamber.

9. The microfluidic device of claim 1, wherein a vertical height of the microfluidic channel measured between the floor and ceiling increases gradually moving from the at least one fluid inlet towards the at least one fluid outlet of the microfluidic channel.

10. A microfluidic device, comprising:
a microfluidic channel formed in the microfluidic device and defined by a floor and a ceiling positioned vertically above the floor;
wherein the microfluidic channel comprises at least one fluid inlet configured to receive a fluid flow and at least one fluid outlet: and
wherein the ceiling of the microfluidic channel is sloped relative to a horizontal plane such that a vertical height of the microfluidic channel measured between the floor and ceiling increases gradually moving from the at least one fluid inlet toward the at least one fluid outlet of the microfluidic channel and whereby buoyancy of one or more air bubbles suspended in the fluid flow urge the one or more air bubbles vertically upwards along the sloped ceiling of the microfluidic channel to form an air bubble trap of the microfluidic device.

11. The microfluidic device of claim 10, further comprising a vacuum chamber defined by a gas permeable membrane, the vacuum chamber in fluid communication with the microfluidic channel and wherein the sloped ceiling of the microfluidic channel extends in the direction of the gas permeable membrane.

12. The microfluidic device of claim 10, wherein the sloped ceiling of the microfluidic channel is configured to transport the one or more air bubbles along the sloped ceiling entirely from the at least one fluid inlet to the at least one fluid outlet.

13. The microfluidic device of claim 10, wherein the microfluidic channel comprises a sloped chamber.

14. A microfluidic device, comprising:
a vacuum chamber defined by a gas permeable membrane; and
a microfluidic channel formed in the microfluidic device and defined by a floor and a ceiling positioned vertically above the floor;
wherein the microfluidic channel comprises at least one fluid inlet configured to receive a fluid flow and at least one fluid outlet: and
wherein the ceiling of the microfluidic channel is sloped relative to both a horizontal plane and the floor, and the permeable membrane is located vertically at above the sloped ceiling of the microfluidic channel to form an air bubble trap of the microfluidic device.

15. The microfluidic device of claim 14, wherein a vertical height of the microfluidic channel measured between the floor and ceiling increases gradually moving from the at least one fluid inlet towards the at least one fluid outlet of the microfluidic channel.

16. The microfluidic device of claim 14, wherein the sloped ceiling of the microfluidic channel is configured to transport the one or more air bubbles along the sloped ceiling entirely from the at least one fluid inlet to the at least one fluid outlet.

17. The microfluidic device of claim 14, wherein the microfluidic channel comprises a sloped chamber.

18. The microfluidic device of claim 14, further comprising a vacuum pump configured to apply a negative pressure to the vacuum chamber, the vacuum pump being located vertically above the sloped chamber whereby the one or more air bubbles are transported through the permeable membrane and into the vacuum chamber.

19. The microfluidic device of claim 14, wherein a vertical height of the microfluidic channel measured between the floor and ceiling increases gradually moving from the at least one fluid inlet towards the at least one fluid outlet of the microfluidic channel.

* * * * *